(12) United States Patent
Poeppel et al.

(10) Patent No.: US 7,974,120 B2
(45) Date of Patent: Jul. 5, 2011

(54) SPIN DEVICE

(75) Inventors: Gerhard Poeppel, Regensburg (DE);
Hans-Joerg Timme, Ottobrunn (DE);
Werner Robl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 12/358,721

(22) Filed: Jan. 23, 2009

(65) Prior Publication Data
US 2010/0188905 A1 Jul. 29, 2010

(51) Int. Cl.
*G11C 11/00* (2006.01)
(52) U.S. Cl. .......... 365/158; 365/171; 365/173
(58) Field of Classification Search .......... 365/158, 365/171, 173
See application file for complete search history.

(56) References Cited

U.S. PATENT DOCUMENTS
6,741,496 B2 * 5/2004 Hannah et al. ............ 365/173

OTHER PUBLICATIONS

Kotissek, P., et al., "Cross-sectional imaging of spin injection into a semiconductor," Nature Physics 3, Oct. 7, 2007, pp. 872-877, Nature Publishing Group, http://www.nature.com/.
Li, Y., et al., "Inversion of Ferromagnetic Proximity Polarization by MgO Interlayers," Physical Review Letters, Jun. 13, 2008, pp. 237205-1-237205-4, vol. 100, No. 23, American Physical Society.

* cited by examiner

*Primary Examiner* — Son Dinh
*Assistant Examiner* — Nam T Nguyen
(74) *Attorney, Agent, or Firm* — Slater & Matsil, L.L.P.

(57) ABSTRACT

According to an embodiment of the present invention, a spin device includes an intermediate semiconductor region arranged between a first terminal and a second terminal, wherein the first terminal is adapted to provide a current having a first degree of spin polarization to the intermediate semiconductor region, and wherein the second terminal is adapted to output the current having a second degree of spin polarization. The spin device further includes a spin selective scattering structure abutting the intermediate semiconductor region, the spin selective scattering structure being adapted such that the first degree of spin polarization is altered to be the second degree, wherein the spin selective scattering structure comprises a control electrode being electrically insulated from the intermediate semiconductor region, and wherein the control electrode is adapted to apply an electrical field perpendicular to a direction of the current through the intermediate semiconductor region to control a magnitude of the current.

27 Claims, 18 Drawing Sheets

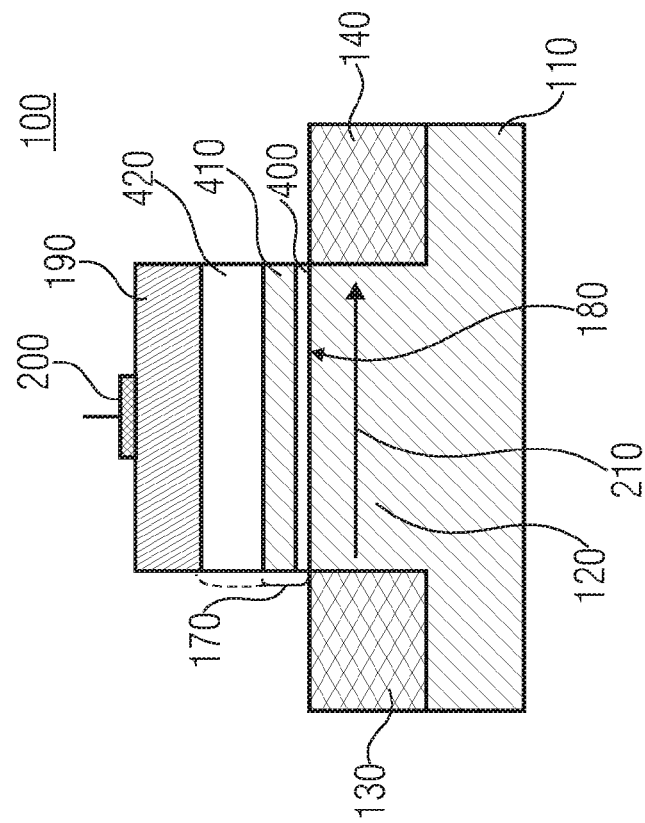
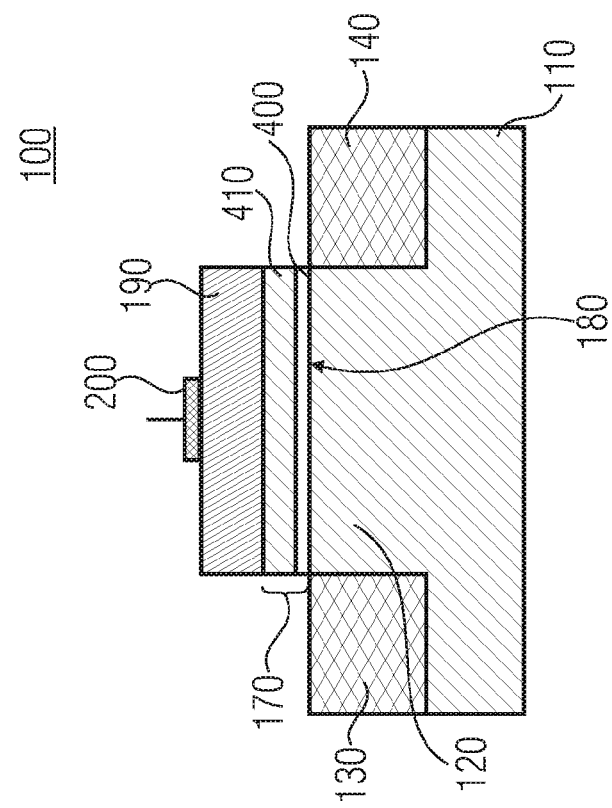
FIG 5A
FIG 5B

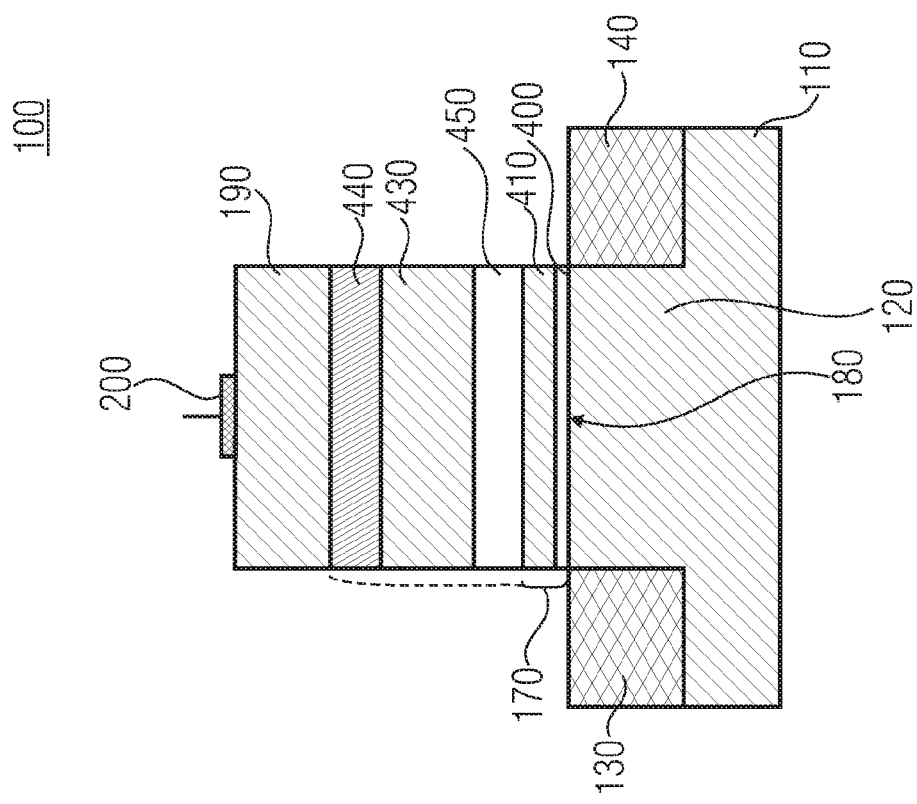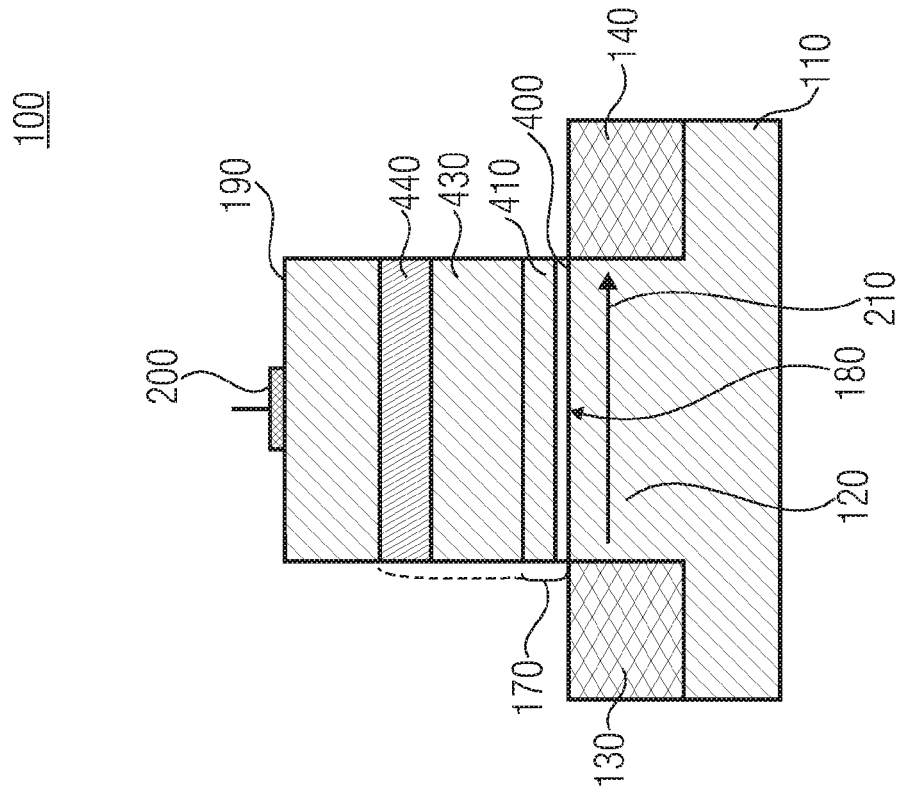

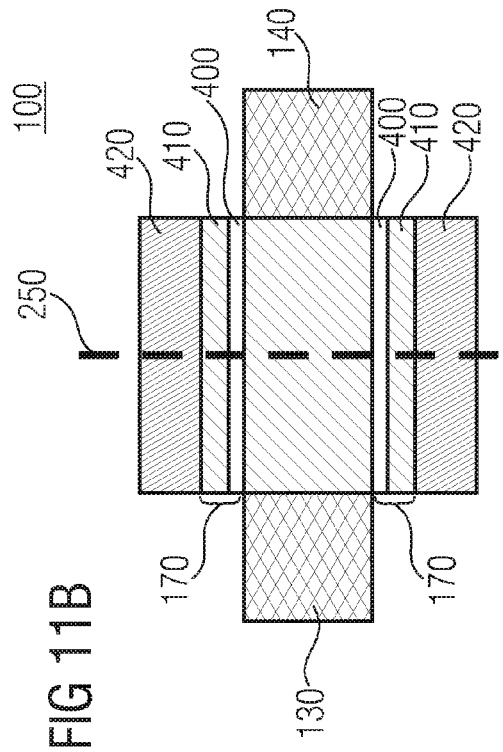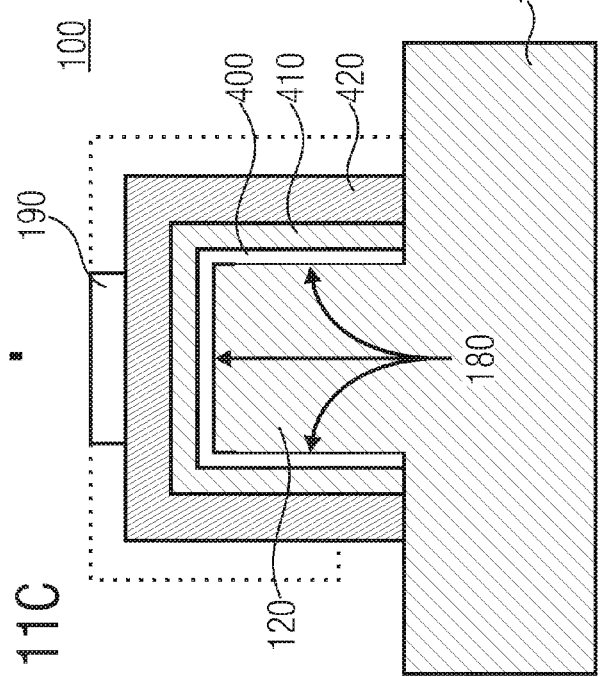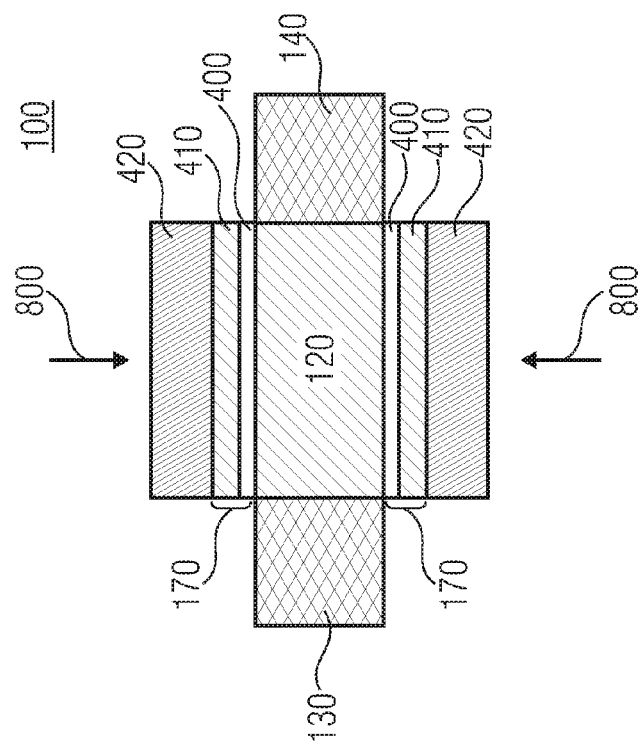

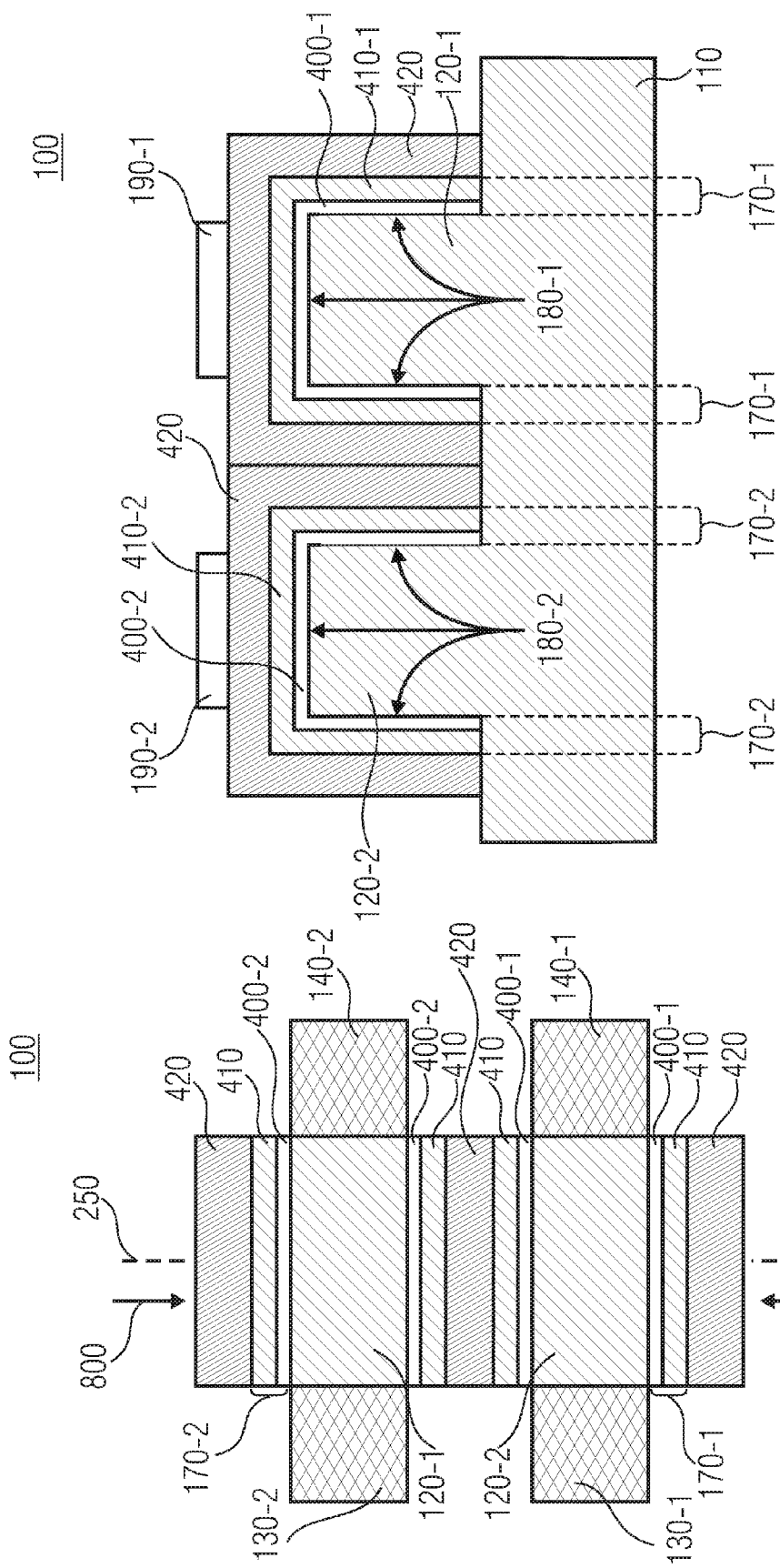

SPIN DEVICE

BACKGROUND

In conventional electrical engineering as well as in conventional electrical and electronic devices, the principle physical quantity of charge carriers employed is their electrical charge. The behavior of the charge carriers, such as electrons, holes, or other quasiparticle excitations, in these devices is mainly influenced by electrical fields, for instance by applying a voltage, or by a magnetic field, which interacts with moving charge carriers by virtue of the Lorentz force.

However, charge carriers often comprise further physical quantities which may be exploited in the framework of appropriate devices. Since such a further physical property of the charge carriers, apart from their electrical charge, may additionally be employed, a further degree of interaction with the charge carriers may be used for the design and construction of novel devices.

Such an additional physical quantity is the spin of charge carriers which is a quantum physical property of electrons, holes and other quasiparticle excitations.

However, to create devices exploiting spin-based physical effects, a source for at least partially spin-polarized currents or charge carriers, as well as a detector for detecting the spin state of charge carriers or a current of charge carriers, is needed to provide and/or to detect interactions with this physical quantity. Needless to say, such a source or a detector should also be compatible with the underlying technology.

While a wide range of metallic elements, compounds and materials exists, which may be utilized to provide or to detect an at least partially spin-polarized current, especially in the field of semiconductor technology, such a source for an at least spin-polarized current or an appropriate detector is still not satisfactorily implemented. In metallic systems, ferromagnetic metals, compounds, or elements such as iron (Fe), cobalt (Co), or nickel (Ni) may be used. However in semiconductor systems and devices this need is still not satisfied.

BRIEF DESCRIPTION OF THE DRAWINGS

Embodiments according to the present invention will be described hereinafter making reference to the appended drawings.

FIG. 2b shows a cross-sectional view of the spin device shown in FIG. 2a;

FIG. 5a shows a cross-sectional view of a spin device according to an embodiment of the present invention;

FIG. 5b shows a cross-sectional view of a spin device according to an embodiment of the present invention;

FIG. 6a shows a cross-sectional view of a spin device according to an embodiment of the present invention comprising a floating gate electrode;

FIG. 6b shows a cross-sectional view of a further spin device comprising a floating gate electrode according to an embodiment of the present invention;

FIGS. 11a and 11b show top views of a spin device according to an embodiment of the present invention in the form of a lateral device;

FIG. 11c shows a cross-sectional view along a line shown in FIG. 11b through the spin device according to an embodiment of the present invention;

FIG. 12a shows a top view of two spin devices according to embodiments of the present invention in the form of lateral devices;

FIG. 12b shows a cross-sectional view of the devices shown in FIG. 12a;

DETAILED DESCRIPTION OF ILLUSTRATIVE EMBODIMENTS

Figure 1A:
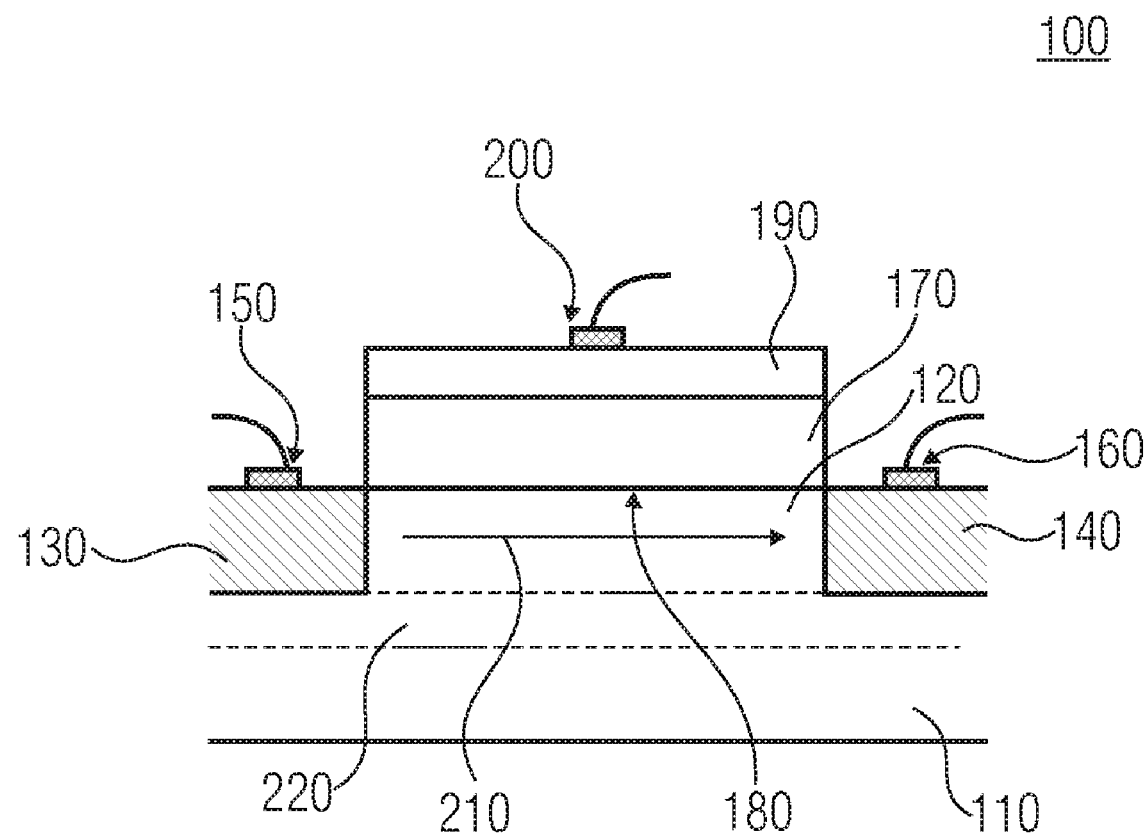
FIG. 1a shows a cross-sectional view of a spin device according to an embodiment of the present invention.

While in conventional electrical and electronic devices the principle physical quantity exploited is the electrical charge, novel devices arise in which further physical quantities such as the quantum mechanical spin are additionally or alternatively exploited. While in conventional devices the charge of charge carriers is exploited by applying electrical fields (e.g., by applying a voltage) or by applying a magnetic field which interacts with a moving charge carrier by virtue of the Lorentz force, additionally exploiting the quantum mechanical spin as a further physical quantity significantly increases the degree of freedom to interact with the charged carriers. The spin of a charge carrier, but also of other uncharged particles, is often accompanied by a magnetic moment. Moreover, the spin of the charge carrier, or a non-charged particle, may also influence the statistical behavior of the respective particles.

In the following, emphasis will be laid on charged particles or quasiparticles, such as electrons and holes which allow not only a manipulation of the spin, but also an interaction based on their charged state, for instance, by applying electrical or magnetic fields.

Exploiting not only the electrical properties of the charge carriers, but also the spin, opens the possibility of implementing so-called spintronic devices or spin electronic devices. The technical field of such devices is sometimes referred to as spintronics.

Spintronics, however, relies on providing charge carriers with an at least partially spin-polarized current and detecting the same. Therefore, a need exists for spin devices capable of providing an at least partially spin-polarized current, spin devices capable of changing a physical, or an electrical property based on a spin polarization of a current provided to such a spin device to act as a spin detector and other spin-related devices. Spin devices according to the present invention may, therefore, be used as switchable spin injection devices, which are sometimes also referred to as switchable spinjectors, spin storage elements, spin control elements, spin detectors, and other spin-related devices for future logic or memory products based on spintronics.

Selective spin injection is, in many applications, an important pre-condition for spin devices in general and for the construction of spin circuitries, which come up as a new kind of electronic technology.

Spin injection is a field of research today. Some of the available ideas comprise a spin injection with a fixed orientation from a metallic magnetic layer (e.g., ferromagnetic layer of iron (Fe), nickel (Ni) or cobalt (Co)) with a fixed orientation to force at least a small fraction of electrons with a certain kind of spin into a semiconductor structure. However, at the interface between the metallic layer and the semiconductor region, the obtainable spin polarization is severely degraded. Moreover, problems may arise when different sources for different spin orientations are demanded in close vicinity to one another.

Among other applications, which will further be outlined below, the following embodiments according to an embodiment of the present invention offer, for instance, the possibility to easily achieve a selective spin injection in semiconducting devices.

Before describing the physical processes and directions leading to spin injection in more detail, first with respect to FIGS. 1a to 3, embodiments according to the present invention will be described. Spin devices according to the present invention comprise a spin selective scattering structure, a possible implementation of which will be outlined in the context of FIGS. 4a and 4b.

It should be noted that in the following a spin-polarized current and an at least partially spin-polarized current will be synonymously used. A spin-polarized current is to be understood as a current in which a relative number of charge carriers, having a first spin orientation, is different from a number of charge carriers having a second spin orientation different from the first orientation. For instance, when two-thirds of the charge carriers of a current comprise the first spin orientation, whereas only one-third of the charge carriers of the current comprise the second, different spin orientation, the spin-polarization or degree of spin-polarization is 2:1 or $\frac{2}{3}$.

Sometimes, the spin polarization is also expressed in terms of a deviation from an unpolarized current. An unpolarized current comprises, as a statistical average, an equal number of charge carriers of either spin orientation. As a consequence, the ratio of the number of charge carriers is 1:1 or $\frac{1}{2}$. Therefore, a spin polarization or a degree of spin polarization may be equally well-expressed in terms of the deviation with respect to the spin polarization of an unpolarized current. In the case of the example above, the spin polarization or degree of spin polarization may be equally well-expressed as 16.67% ($=\frac{1}{6}=\frac{2}{3}-\frac{1}{2}$). Based on the second definition of the spin polarization, a fully spin-polarized current, in which all charge carriers have the same spin orientation, has spin polarization of 100% ($=1=1-0$), whereas an unpolarized current has a spin polarization of 0% ($=0=\frac{1}{2}-\frac{1}{2}$).

To distinguish between the two definitions of spin polarization, in the following a spin polarization expressed in terms of a percentage value refer to deviation of a spin polarization with respect to the spin contributions of an unpolarized current, whereas a spin polarization expressed in terms of a ratio is directly related to the number of respective charge carriers.

Moreover, unless stated otherwise in the following, devices according to embodiments of the present invention will be described based on semiconductor implementations. Such spin devices may be implemented based on electrons or based on holes as charge carriers. Therefore, unless stated otherwise, whenever charge carriers are referred to, an implementation based on electrons or holes may in principle equally well be used. However, some differences may arise, since holes and electrons may comprise different parameters and physical quantities.

As a last comment before describing a first embodiment according to the present invention, it should be noted that in many implementations, the charge carriers are spin $\frac{1}{2}$-particles which means that these particles may only acquire two distinguished spin states, which are denoted as $+\frac{1}{2}$ and $-\frac{1}{2}$, respectively. In some devices, for instance, when a specific interaction (e.g., spin orbit interaction) becomes the dominating interaction, the spin may be replaced by an effective quantum number indicating an overall momentum, which may lead to the charge carriers acquiring effective momentum quantum numbers being different from the previously mentioned two states. However, in most cases, considering the charge carriers as being capable of only acquiring the two previously mentioned spin states $+\frac{1}{2}$, $-\frac{1}{2}$, is not only a sufficient description to understand the electrical behavior of the spin devices, but also an accurate description in terms of the underlying physics.

FIG. 1a shows a cross-sectional view of a spin device 100 according to an embodiment of the present invention based on a semiconducting substrate 110. The substrate 110 comprises an intermediate semiconductor region 120 which is arranged between a first terminal 130 and a second terminal 140. The terminals 130, 140 may, for instance, be implemented as doping areas. The first terminal 130 may be coupled to a first contact 150, which is schematically shown in FIG. 1a. Accordingly, the second terminal 140 may be coupled, in a similar manner, to a second contact 160.

The spin device 100 further comprises, on top of and abutting the intermediate semiconductor region 120, a spin selective scattering structure 170, such that an interface 180 is formed between the spin selective scattering structure 170 and the intermediate semiconductor region 120. In the embodiment shown in FIG. 1a, a control electrode 190 is deposited on top of the spin selective scattering structure 170, which extends along the cross-sectional view of FIG. 1a along the whole length of the spin selective scattering structure 170. A control contact 200 may be coupled to the control electrode 190 to allow an electrical contact of the electrode 190.

Concerning the mode of operation of the spin device 100 as shown in FIG. 1a, the first terminal 130 is adapted to provide a current with a first degree of spin polarization to the intermediate semiconductor region 120. Depending on the circumstances of the operation and other parameters, the first degree of spin polarization may, for instance, be that of an unpolarized current, i.e. spin polarization 1:1 or 0%. Therefore, charge carriers of the current are injected into the intermediate semiconductor region 120 via the first contact 130. Here, the charge carriers interact with the spin selective scattering structure 170 via the interface 180. As a consequence, the charge carriers are spin selectively scattered such that the degree of spin-polarization of current changes. It changes in such a manner that the degree of spin polarization of the current having passed the intermediate semiconductor region 120 and provided by the second terminal 140 comprises a second degree of spin-polarization, which may be typically different from the first spin-polarization.

However, it may happen that the first degree of spin polarization is equal to the second degree of spin polarization. This occurs, for instance, when the degree of the spin-polarization of the current provided to the intermediate semiconductor region 120 is equal to an equilibrium distribution of the charge carriers among the two spin orientations, after having traveled through the intermediate semiconductor region 120 and interacting with the interface 180, or the spin selective scattering structure 170. This is a situation which may occur, for instance, in the case of the spin device 100 operating as a spin detector.

It should be noted that the magnitude of the current is, to a good approximation, not changed by the interaction of the charge carriers with the spin selective scattering structure 170. The distribution of the spin orientations between the two possible spin orientations (in the case of a two-spin state system) or among the number of available spin states is merely altered by the interaction of the charge carriers with the selective scattering structure 170. No charge carriers are typically trapped or removed on a long term basis from the current flowing between the first and second terminals 130, 140 by the spin selective scattering structure 170. The amount of charge transported, and hence the magnitude of the current, is not influenced by the spin selective scattering structure 170.

Due to spin selective scattering processes, such as processes comprising a spin flip, or an increased number of scattering incidences for one spin orientation compared to the number of interactions for the other spin orientation, this may lead to the described alteration of the distribution of the charge carriers among the available spin states.

In embodiments according to the present invention, the spin selective scattering structure 170 may comprise an electrically insulating layer to, for instance, prevent electrical short circuits or other unwanted influences between the spin selective scattering structure 170 and the intermediate semiconductor region 120.

The spin device 100 according to an embodiment of the present invention is capable of controlling the magnitude of the current by applying an electrical field having a main component perpendicular to a direction 210 of the current through the intermediate semiconductor region 120. In the following, for the sake of simplicity only, electrical fields having a main component perpendicular to an intermediate semiconductor region, a direction of a current or a similar structure or direction will be referred to as an electrical field being perpendicular to the respective direction or structure. An electrical field being perpendicular to such a structure or direction or having a main component perpendicular to such a structure or direction is an electrical field with a relevant component in terms of the underlying physics. Hence, in some cases stray fields or other deviations from ideal conditions may have to be considered not to have a main component or being perpendicular. Electrical fields being applied in the range of angles with respect to a normal up to 60°, 45°, 30° or 10° may be considered as having a main component perpendicular and, hence, being perpendicular, depending on the implementation in mind.

Depending on the concrete implementation of a spin device 100, according to an embodiment of the present invention, the physical effect employed may be different. For instance, the spin device 100 may be implemented as a field effect transistor (FET=Field Effect Transistor), such that the first terminal 130 and the second terminal 140 may be implemented as a source terminal and drain terminal, or vice versa. In this case, a channel or a channel region is formed in at least a part of the intermediate semiconductor region 120, the electrical properties of which are controlled by the electrical field applied via the control electrode 190, which may also be referred to as a gate electrode in case of a FET. For instance, in the case of an implementation in the form of an enhancement field effect transistor, by applying a sufficiently strong electrical field, the channel region between the first and second terminals 130, 140, is formed. In the case of an n-channel field effect transistor, the intermediate semiconductor region may be formed by a p-type semiconductor region, while the first and second terminals 130, 140 may be formed as n-type regions or wells.

Naturally, a spin device 100 based on such a FET layout may also be implemented as a depletion FET, a p-channel FET or a p-channel enhancement FET. In the case of a p-channel enhancement FET, the intermediate semiconductor region 120 comprises an n-type semiconductor region in which the appropriate p-channel region is formed by applying the respective electrical field. In this case, the first and second terminals 130, 140 are also p-type semiconductor regions or wells. For the sake of simplicity only, doping profiles and regions are not shown in the Figs.

However, in different embodiments according to the present invention, the spin device 100 may also be formed on the basis of different semiconductor devices. For instance, the intermediate semiconductor region 120 may be based on a thin layer of semiconductor material deposited on top of an insulating layer 220 which may optionally be implemented, as shown by the dashed lines in FIG. 1a. Such a buried insulating layer 220 may, for instance, be fabricated based on the available SOI-techniques (SOI=Silicon on Insulator). Among the available techniques, the SIMOX-technique (SIMOX=Separation by Implantation of OXygen) or the BESOI-technique (BESOI=Bonded Etched-Back Silicon on Insulator) exist, to name but two. Such an embodiment according to the present invention will be described in more detail with respect to FIG. 2, which includes FIG. 2a and 2b.

Therefore, embodiments according to the present invention in the form of a spin device 100 are based on the finding that the generation of a spin-polarized current or detection of a degree of spin-polarization is achievable in a semiconductor structure (intermediate semiconductor region 120), by providing spin selective scattering structure 170 abutting the intermediate semiconductor region 120 to eventually influence the degree of spin polarization. The magnitude of the current is controllable via the electrical fields applicable perpendicular to the direction 210 of the current, which is directed from the first terminal 130 to the second terminal 140. As a consequence, a spin device 100, according to an embodiment of the present invention, may offer the possibility of providing a spin-polarized current or to detect a spin-polarized current in a semiconductor region in a controllable manner.

A spin device 100 according to an embodiment of the present invention may be employed as a detector or an injector for a spin-polarized current. Hence, a spin device 100 according to an embodiment of the present invention may eventually be comparable to an optical polarization filter which may also be used as a generator for polarized light in the framework of a light source, or as a filter in the framework of the detector. Therefore, a spin device 100 may also operate as a filter or a generator, as the optical analogy shows. However, in contrast to the optical polarization filter, it is further capable of controlling the magnitude of the current.

With respect to FIG. 1a, it should be noted that it may be possible to restrict the extension of the control electrode 190 to a smaller area, compared to the extension of the control electrode 190, as shown in FIG. 1a. For instance, by restricting the control electrode 190 to only the central region directly underneath the control contact 200, the perpendicular electrical field induced into the intermediate semiconductor region 120 may create a modification of the potentials present in the intermediate semiconductor region 120, so that the transport of the charge carriers, and hence, the current, will be affected.

However, since the selective spin scattering effect is caused by an interaction of the charge carriers with the interface 180 formed between the spin selective scattering structure 170 and the intermediate semiconductor region 120, a thickness of the intermediate semiconductor region 120 should be limited to ensure a sufficiently high number of charge carriers transported between the first and second terminals 130, 140 will interact with the interface 180 or the spin selective scattering structure 170. Hence, a thickness of the intermediate semiconductor region 120 should be below 100 nm, or in different embodiments, below 10 nm, unless a physical or design process is employed to spatially limit the extension an effective layer in which the current flows from the first to the second terminals 130, 140. In the case of a spin device 100 based on a FET-design, this may be achieved by forming, during operation, the channel in a spatially limited layer underneath the interface 180 by applying a voltage to the control electrode 190.

Moreover, in embodiments according to the present invention, the electrical field leading to the forming of the channel may further attract the charge carriers to the interface 180 to increase the interaction, leading to an increased spin-polarization. This biasing effect will be outlined in more detail below.

When designing a specific spin device 100, according to an embodiment of the present invention, a length of the intermediate semiconductor region 120 and the spin selective scattering structure 170 may also be considered with respect to the thickness of the intermediate semiconductor region 120. As will be outlined in more detail below, a typical length along the direction 210 of the spin selective scattering structure 170 is in the range of about 200 nm and above. For instance, when implementing intermediate semiconductor region 120 in the range of about 1 μm to several hundred μm (e.g., 500 μm) a technically feasible degree of spin polarization may be achieved at the second terminal 140. In other words, the length of the spin selective scattering structure 170 may be in the order of a typical dimension of a micro-structured device.

The previously described embodiments according to the present invention, may also be combined in such a manner that the control electrode 190 is limited to a central or another smaller part of the intermediate semiconductor region 120. In this case, the intermediate semiconductor region 120 may further comprise doped wells, so that the channel area itself is limited to a comparably small fraction (e.g., 20 nm to 100 nm) of the intermediate semiconductor region 120, while the interface 180 extends over the length of more than about 100 nm, or more than about 1 μm or above.

Before discussing the possibilities and the general concept of the working principles of spin devices 100 according to the present invention in more detail, it should be noted for the sake of completeness that the spin selective scattering structure 170 typically comprises an insulating material such that the control electrode 190 is, when positioned above the spin selective scattering structure 170, electrically insulated from the intermediate semiconductor region 120 to prevent short-circuits. Moreover, the spin selective scattering structure 170 may also comprise additional insulating layers to reduce the risk of a breakthrough or an avalanche when applying a voltage to the control electrode 190, which may increase the electrical field beyond a threshold's characteristic for a spin selective scattering structure 170. Depending on the implementation in mind, it may for instance, be advisable to implement a spin device 100 such that the control voltages of more than 5 V, more than 10 V (e.g., 15 V), more than 50 V, or other voltages to be applicable to the control electrode 190. Naturally, a spin device 100 may also be implemented such that other than the previously mentioned voltage levels may be used.

Figure 1B:
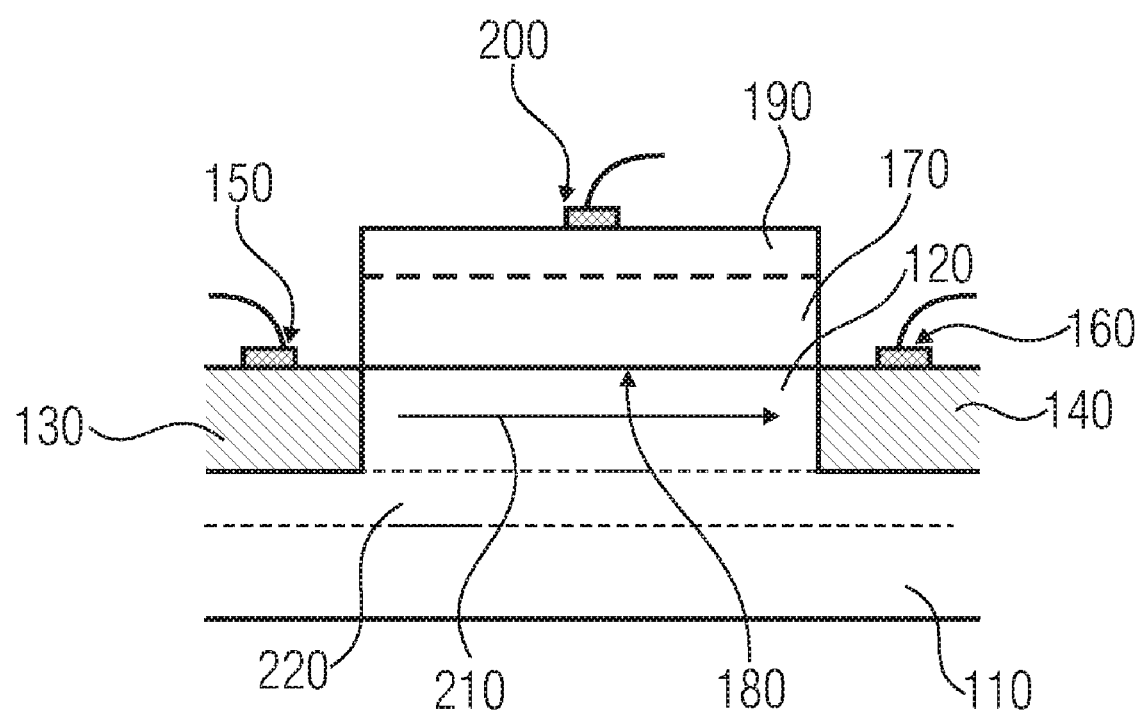
FIG. 1b shows a cross-sectional view of a spin device according to a further embodiment of the present invention.

FIG. 1b shows a further embodiment according to the present invention in the form of a spin device 100, which differs from the one shown in FIG. 1a mainly with respect to the control electrode 190 and the spin selective scattering structure 170. In the embodiment of the spin device 100 shown in FIG. 1b, the control electrode is comprised in the spin selective scattering structure 170, as indicated by a dashed line in FIG. 1b. In other words, the control electrode 190 is part of the spin selective scattering structure 170.

To offer, if advisable, an electric insulation of the control electrode 190 from the intermediate semiconductor region 120 and the interface 180, the spin selective scattering structure 170 may further comprise an insulating layer arranged between the control electrode 190 and the interface 180. In other words, in FIG. 1b, the part of the spin selective scattering structure 170 shown underneath the control electrode 190 may comprise or may be formed by an insulating layer. Depending on implementation details, it may be advisable to implement such an insulating layer with certain boundary conditions. However, this may only be the case for some implementations, as will be outlined in more details below.

Comparing the embodiments shown in FIGS. 1a and 1b, that further illustrates two different approaches which may be taken in the case of some embodiments according to the present invention in the form of a spin device 100. In the case of some, but not all embodiments according to the present invention, the structures and layers arranged over the intermediate semiconductor region 120, on the one hand may be considered to be comprised in the spin selective scattering structure 170. This may also include the control electrode 190, for instance, when the control electrode 190 fulfills not only a single function, but also a function with respect to the spin scattering property of the charge carriers. This may, for instance, be caused by the material composition of the control electrode, when, for instance, being fabricated from a ferromagnetic metal.

On the other hand, the control electrode 190 may also be considered not to be part of the spin selective scattering structure 170, when the spin selective scattering structure is, for instance, capable of performing its functionality of influencing the scattering properties of the charge carriers. Both perspectives may equally well be suitable, when the spin selective scattering structure 170 is capable of performing its basic functionality without the control electrode 190, irrespective of the question as to whether the control electrode may enhance, alter or influence the spin scattering properties. This may be the case when the control electrode comprises a ferromagnetic metal.

A spin device 100 according to an embodiment of the present invention may offer the opportunity to implement a current source or a detector for a spin-polarized current on the basis of semiconductor technology. A spin device 100 may be implemented on the basis of silicon, as well as other semiconducting materials. Silicon (Si), for instance, comprises a spin diffusion length over which the spin polarization decays exponentially, which is large, when compared to typical dimensions of these devices. Silicon, for instance, may comprise a spin diffusion length of up to several centimeters, up to several ten centimeters, so that in the case of silicon, as a good approximation, the current of the two spin orientations may be considered independently from one another in the framework of a so-called two fluid model. Moreover, since in the case of a FET-like implementation of a spin device 100, the doping profiles do not necessarily differ from those of FETs, spin devices 100 based on silicon may be an attractive form of an implementation of such a device. Since in the case of an implementation on the basis of an enhancement FET, a voltage is to be applied to the control electrode 190 to form the inversion channel at the interface 180, such an implementation may even provide a comparably high degree of spin polarization, since the charge carriers will be attracted towards the interface 180 by the applied voltage, which may increase the interaction with the selective spin scattering structure 170 (biasing effect).

However, also other FET structures and other semiconductor structures may be used in the framework of the intermediate semiconductor region 120 as the previous discussion has shown. In principle, even an implementation on the basis of a thick semiconductor region forming the intermediate semiconductor region 120 ("bulk"-implementation) may be used. However, in such a case the number of interactions of the charge carriers at the interface 180 might be limited which also leads to a comparably small degree of spin polarization obtainable at the second terminal 140.

Spin devices 100 may also be implemented on the basis of other semiconducting materials, such as materials forming a two-dimensional electron gas (e.g., AlGaAs). These materials also offer the possibility of a thin conducting layer close to the interface 180 between an intermediate semiconductor region 120 and the spin selective scattering structure 170. However, AlGaAs typically offer a smaller characteristic spin diffusion length, which may be below 10 µm, often even below 1 µm.

Figure 2A:
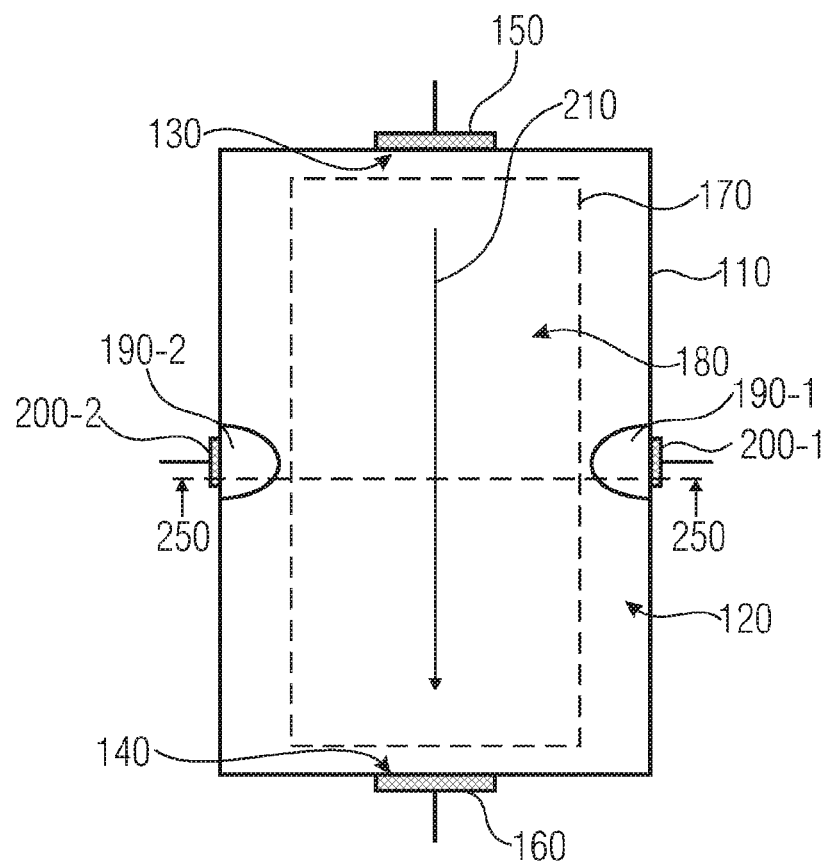
FIG. 2a shows a top view of a spin device according to an embodiment of the present invention.

FIG. 2a shows a schematic top view of a further spin device 100' according to an embodiment of the present invention. The spin device 100' is based on a JFET-implementation (JFET=Junction Field Effect Transistor) with a substrate 110 that comprises an intermediate semiconductor region 120. The spin device 100' also comprises a first terminal 130 and a second terminal 140, which are adapted to provide current having a first spin polarization to the intermediate semiconductor region 120 and to extract a current having a second degree of spin polarization from the intermediate semiconductor region 120, respectively. As shown in FIG. 1a, the first terminal 130 may be coupled to a first contact 150 and the second terminal 140 may be coupled to the second contact 160. A selective spin selective scattering structure 170, which is shown as a dashed rectangle in FIG. 2a, is formed on top of the intermediate semiconductor region 120, to provide an interface 180 between the intermediate semiconductor region 120 and the spin selective scattering structure 170.

Moreover, the spin device 100' comprises a first control electrode 190-1 and a second control electrode 190-2 which may be coupled to a first control contact 200-1 and a second control contact 200-2, respectively. However, in contrast to the spin device 100 shown in FIG. 1a, the two control electrodes 190 are not electrically insulated from the intermediate semiconductor region 120 by an insulating layer, but by a reverse-biased pn-junction. To achieve this, the intermediate semiconductor region 120 comprises a first doping, e.g., an n-type doping, while the control electrodes 190-1, 190-2, comprise a complementary doping, e.g., p-type doping. As a consequence, when applying a corresponding voltage to the control electrodes 190, a reverse-biased pn-junction is formed between the intermediate semiconductor region 120 and the control electrodes 190. By varying the voltage applied to the control electrodes 190, a depletion zone can be varied in terms of its extension so that an electrical field is once again applied perpendicular to a direction 210 of the current from the first terminal 130 to the second terminal 140. As a consequence, by applying the control voltages to the control electrodes 190, the electrical field perpendicular to the direction 210 influences a width of the conducting area in the intermediate semiconductor region 120, which allows control of the magnitude of the current.

Figure 2B:
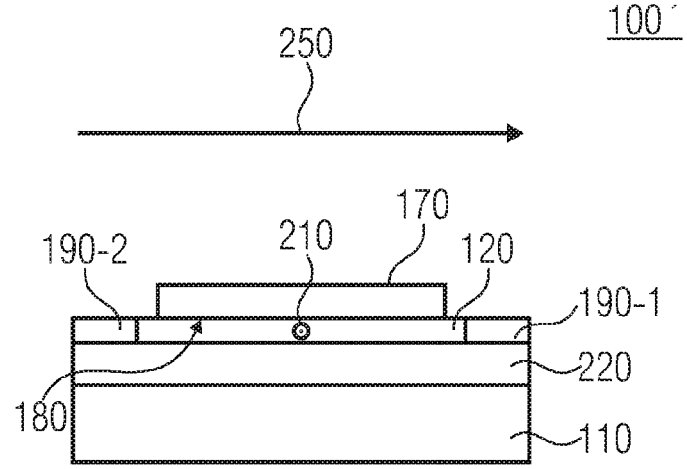

To describe the structure of the spin device 100' shown in FIG. 2a in more detail, FIG. 2b shows a cross-sectional view of the device along a line 250. The spin device 100' is based on a substrate 110 which comprises an insulating layer 220 which limits the intermediate semiconductor region 120 in terms of its thickness. The two control electrodes 190-1, 190-2, are, accordingly, also limited to the thickness of the intermediate semiconductor region 120. However, in different implementations of the spin devices 100', the control electrodes 190-1, 190-2 may eventually also extend into the insulating layer 220 or may not penetrate the intermediate semiconductor region 120 at all.

FIG. 2b together with FIG. 2a furthermore shows that the spin selective scattering structure 170 does not completely cover the intermediate semiconductor region 100. Therefore, the interface 180 is not formed over the whole surface of the intermediate semiconductor region 120. This implementational detail is, however, by far not limited to spin devices 100' in the form of JFET-like devices. In principle, the spin selective scattering structure 170 may also be limited in terms of its extension in the case of FET-like devices, as shown in FIG. 1a.

Figure 3:
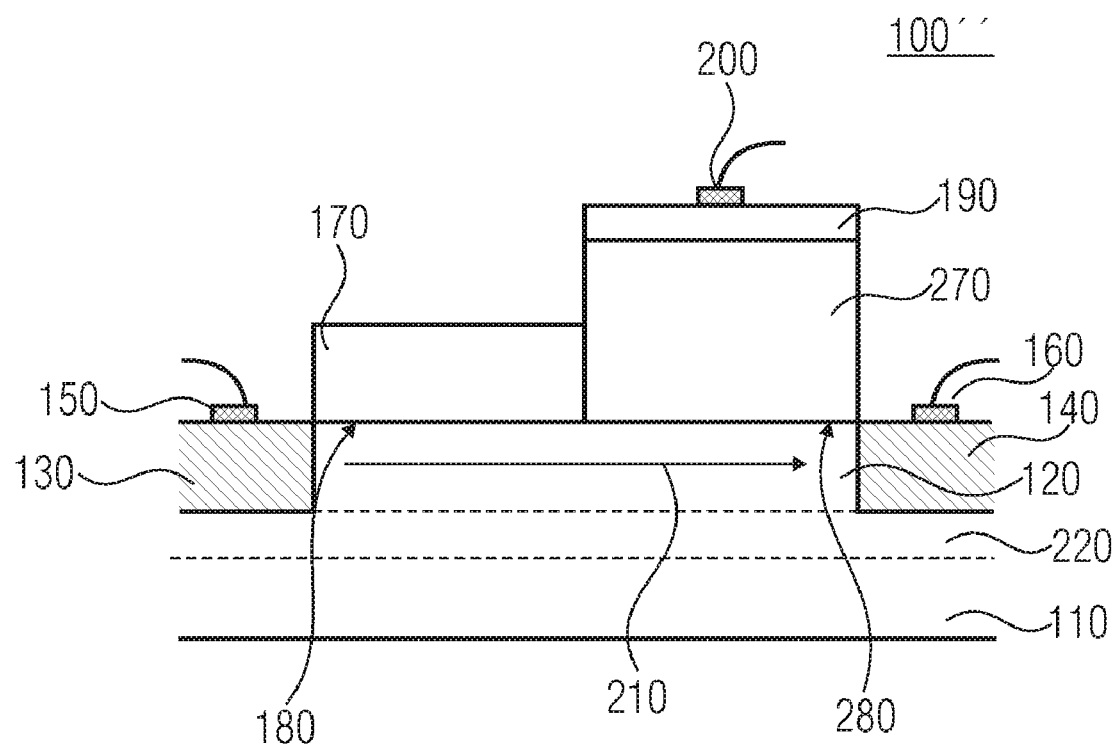
FIG. 3 shows a cross-sectional view of a spin device according to a further embodiment of the present invention.

Before describing a third embodiment according to the present invention with respect to FIG. 3, it should be noted that structures and objects with identical or similar functional or structural properties will be denoted with the same or similar reference signs. For example, the spin device 100 shown in FIG. 1a and the spin device 100' are denoted by similar reference signs. Moreover, unless noted otherwise, structures and objects denoted by the same or similar reference signs may be implemented equally having equal electrical, mechanical, or other properties and dimensions. Naturally, objects and structures denoted by the same or similar reference signs may be implemented differently.

Moreover, summarizing reference signs will be used for objects and structures appearing more than once in an embodiment or a figure. For example, in FIGS. 2a and 2b, the two control electrodes 190-1, 190-2 are referred to by their summarizing reference signs 190, unless specifically referring to a control electrode. The spin devices 100, 100' shown in FIGS. 1 and 2, respectively, will be referred to by their summarizing reference sign 100, unless a specific detail of either of the spin devices is referred to.

FIG. 3 shows a further embodiment according to the present invention of a spin device 100", which is similar to the spin device 100 shown in FIG. 1a. The spin device 100" of FIG. 3 also comprises a substrate 110, which in turn comprises an intermediate semiconductor region 120. The intermediate semiconductor region 120 is arranged between a first terminal 130 and a second terminal 140, which are contacted by a first contact 150 and a second contact 160, respectively.

The spin device 100" further comprises a selective spin scattering structure 170 abutting the intermediate semiconductor region 120 to form an interface 180 between the spin selective scattering structure 170 and the intermediate conductor region 120. However, in contrast to the embodiment shown in FIG. 1a, the spin selective scattering structure 170 does not extend over the whole length of the intermediate semiconductor region 120, as shown in the cross-sectional view of FIG. 3. The spin selective scattering structure 170 only covers a fraction of a surface of the intermediate semiconductor region 120 such that this fraction of the surface forms the interface 180 only, by which charge carriers injected into the intermediate semiconductor region 120 from the first terminal 130 interact to alter the degree of spin polarization of the current.

The spin device 100'' shown in FIG. 3 also comprises a control electrode 190, which is electrically connectable to a further circuit or element by a control contact 200. However, the control electrode 190 is electrically insulated from the intermediate semiconductor region 120 by a further insulating layer 270 abutting the intermediate semiconductor region 120. The further insulating layer 270 and the intermediate semiconductor region 120, hence, form a further interface 280, which may abut the interface 180, but is also separated from this.

The spin device 100'' shown in FIG. 3, therefore, differs from the spin device 100 shown in FIG. 1a by the control electrode 190 being laterally displaced with respect to the spin selective scattering structure 170. While in the embodiment shown in FIG. 1a the control electrode 190 is arranged on top of the spin selective scattering structure 170, which also electrically insulates the control electrode from the intermediate semiconductor region 120, the electrical insulation is realized in the embodiment shown in FIG. 3 by the further insulating layer 270. As a result, the functional parts of spin selectively scattering the charge carriers by the spin selective scattering structure 170 and the respective interface 180 on the one hand, and controlling the magnitude of the current by applying an electrical field perpendicular to a direction 210 of the current between the first terminal 130 and the second terminal 140 on the other hand, may spatially be separated from one another. This may enable, for instance, separately optimizing the spin selective scattering structure 170 on the one hand and the controlling structure controlling the magnitude of the current comprising, in the embodiment shown in FIG. 3, the further insulating layer 270, the control electrode 190 and the control contact 200 on the other hand.

It may happen, for instance, that the spin selective scattering structure 170 is influenced by the electrical field applied by the control electrode 190. This influence may be reduced, or even omitted, by spatially separating both. Moreover, by introducing the further insulating layer 270, the control electrode 190 may be operated at different voltage levels, since a thickness of the further insulating layer 270 may be chosen independently of the spin selective scattering structure 170. It may, therefore, be possible to operate the spin device 100'' with higher control voltages applied to the control electrode 190, due to the possibility of implementing a thicker further insulating layer 270 without surpassing a breakthrough electrical field of the further insulating layer 270, which may cause an avalanche of charge carriers and the creation of a conducting channel through the further insulating layer 270 destroying the spin device 100''.

In other words, the spin selective scattering structure 170 and the controlling structure comprising the control electrode 190 form a series connection with the spin selective scattering structure 170 being coupled before the controlling structure, with respect to the direction of the current 210. In different embodiments, the order of the two structures may equally well be reversed, placing the spin selective scattering structure 170 behind the controlling structure.

However, as a possible drawback of this solution, the surface of the intermediate semiconductor region 120 may eventually not be used as efficiently as in the case of the spin device 100 shown in FIG. 1a, since the surface of the intermediate semiconductor region 120 in FIG. 3 comprises two distinct areas forming the interface 180 and the further interface 280. This may, eventually, not be a significant drawback, since depending on implementation details, the further interface 280 may eventually be significantly smaller in terms of its length along the direction of the current 210, compared to a length of the interface 180.

In the case of a FET-like implementation of the spin device 100'', the channel or channel area will mostly be formed in the area of the further interface 280. Hence, the length of the further interface 280 may, in principle, be limited to a minimal length necessary to control the admissible current. Depending on implementation details, the length of the further interface 280 may, in principle, be limited to less than about 100 nm, while the length of the interface 180 is longer than about 1 µm.

As an optional implementation, the spin device 100'' may also comprise an insulating layer 220, as already shown and discussed in the framework of the spin device 100 shown in FIG. 1a. As all insulating layers described herein, the insulating layer 220, as well as the further insulation layer 270 may comprise an oxide material, a nitrite material, an oxynitride material, or another insulating material (e.g., ONO (Oxide-Nitride-Oxide)).

Furthermore, although FIG. 3 shows the spin selective scattering structure 170 being positioned before the control electrode 190 along with the further insulating layer 270, the direction of the current 210 may equally well be reversed, as hinted to before. In principle, the spin device 100'' may be designed symmetrically so that the second terminal 140 shown in FIG. 3 may also be considered to be the first terminal 130 and vice versa. Accordingly, by inverting the direction 210 of the current, the control electrode 190 may likewise be arranged before the spin selective scattering structure 170. With respect to the operational principle, this is of no importance. In yet other words, an order of the arrangement of the control electrode 190 and the spin selective scattering structure 170 may be reversed as shown in FIG. 3.

So far, the description of the embodiments as shown in FIGS. 1 to 3 have mainly focused on the arrangement of the spin selective scattering structure 170 with respect to the control electrodes 190 and the different principles on which a spin device 100 may be implemented. In the following, a possible implementation of a spin selective scattering structure 170 will be described in more detail in context with FIGS. 4a and 4b.

Based on fundamental finding, embodiments according to the present invention offer a new method for a controllable selective spin injection, for example, by applying a gate or control voltage.

Figure 4A:
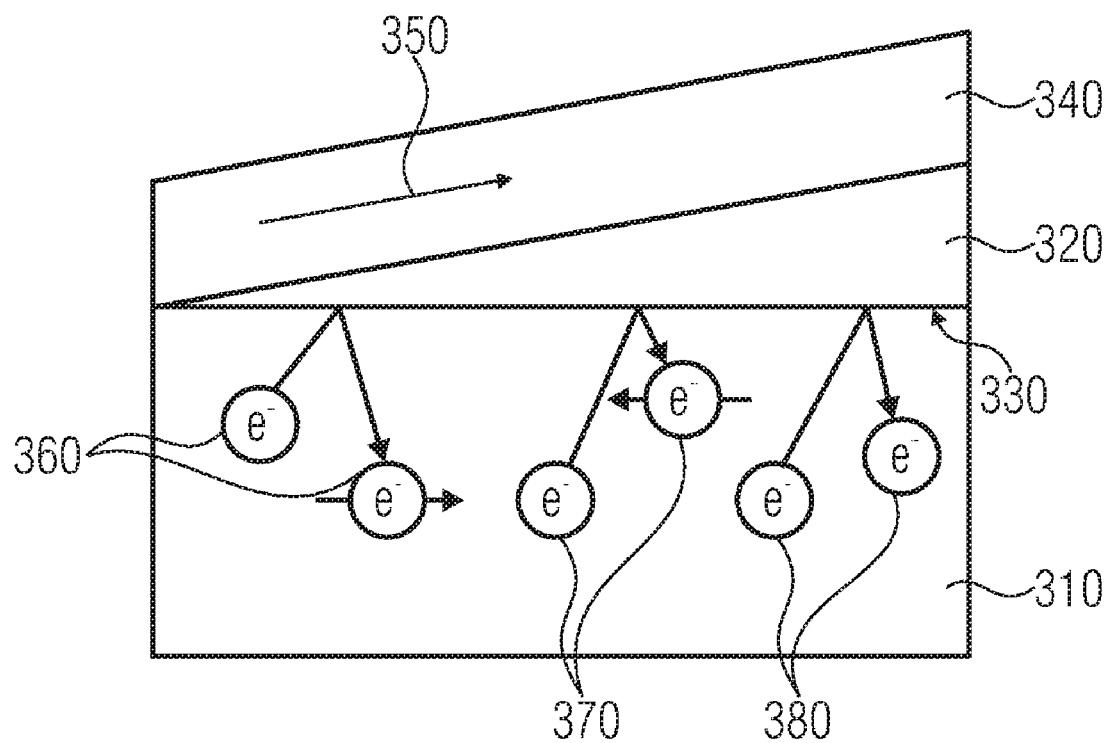
FIGS. 4a and 4b illustrate the operational principles of a spin selective scattering structure as employed in embodiments according to the present invention.

FIG. 4a shows an arrangement 300 for evaluating the possibility of spin-dependence scattering of electrons at an interface between a semiconductor and a thin, wedge-shaped magnesium oxide layer (MgO) covered by a ferromagnetic material. The arrangement 300 comprises a semiconductor region 310 and a wedge-shaped oxide layer 320 based on MgO so that an interface 330 is formed between the semiconductor region 310 and the oxide layer 320. In the arrangement 300 shown in FIG. 4a, a thickness of the oxide layer 320 rises from 0.2 nm (2 Å) and a thickness of more than 1.5 nm (15 Å). A ferromagnetic layer 340 is positioned on top of the oxide layer 320.

The ferromagnetic layer 340 comprises a sufficient thickness and a sufficient area to enable the ferromagnetic layer 340 to form domains such that the ferromagnetic layer 340 may comprise a (more or less constant) magnetization 350. The ferromagnetic layer 340 may be formed by any ferromagnetic material such as ferromagnetic metals, iron (Fe), cobalt (Co), and nickel (Ni). Moreover, as a ferromagnetic material more complex compounds may be used such as rare earth magnets comprising alloys of rare earth elements (e.g., neodymium magnets ($Nd_2Fe_{14}B$), samarium magnets ($SmCo_5$)). Ferrite magnets with a chemical formula $AB_2O_4$ wherein A and B represent various metal cations, usually including iron (e.g., Zinc Ferrite "ZnFe", $ZnFe_2O_4$), as well as "Alnico" magnets comprising an alloy of aluminum (Al), nickel (Ni), cobalt (Co), along with optional additional iron (Fe), copper (Cu), and sometimes titanium (Ti), Heusler alloys, magnetite ($Fe_3O_4$), doped insulators and semiconductors (e.g., doped with manganese (Mn)) and other conventionally known ferromagnetic materials (e.g., $FeOFe_2O_3$, $NiOFe_2O_3$, CuO Fe2O3, MgO Fe2O3, $CrO_2$, and EuO may also be used.

The following experimental results, are however, based on iron (Fe) as the ferromagnetic material of the ferromagnetic layer 340 and magnesium oxide (MgO) for the oxide layer 320. Depending on the thickness of the oxide layer 320 and the orientation or the magnetization 350 of the ferromagnetic layer 340, different kinds of spin orientated electrons may be obtainable after a reflection at or an interaction with the interface 330.

Starting at comparably small thicknesses of the oxide layer 320 of less than 0.2 nm (2.0 Å), electrons are preferably scattered at the interface 330 with a spin direction parallel to the magnetization 350 of the ferromagnetic layer 340, as schematically indicated in FIG. 4a, an electron 360 having either spin polarization before the scattering event and being reflected with a preferable spin orientation to the magnetization 350. This spin selective scattering property which is also sometimes referred to as ferromagnetic proximity polarization (FPP) is followed by a steep reduction with increasing thicknesses of the oxide layer 320 and a sign reversal, as schematically indicated by an electron 370 in FIG. 4a.

As FIG. 4a schematically shows, the electron 370 approaches the interface 330 with either spin polarization and will be scattered preferably with a spin orientation opposite to the magnetization 350 of the ferromagnetic layer 340. While the FPP spin polarization is enhanced with a thickness of approximately 2.0 Å (0.2 nm) of magnesium oxide for the schematically shown electron 360, the spin polarization comprises the opposite sign when the magnesium oxide thickness is approximately 7.0 (0.70 nm) to 7.9 Å (0.79 nm). At a thickness of approximately 5.0 Å (0.5 nm), the FPP spin polarization crosses zero so that the spin polarizing effect is significantly suppressed.

Increasing the thickness of the oxide layer 320 over the previously mentioned 7.0 to 7.9 Å, at which the sign reversal of the FPP spin polarization occurs will once again results in a reduction and, finally, into a vanishing of the FPP at approximately 12 Å (0.12 nm) to 14.0 Å (0.14 nm), 15.0 Å (0.15 nm) and above. This is schematically illustrated by an electron 380, which after a scattering process at the interface 330, does not comprise a preferred spin orientation.

The experiment described above has been carried out based on the longitudinal Magneto-Optic Kerr Effect (MOKE) on the basis of magnesium oxide layers and a Gallium Arsenide layer (GaAs) on an Aluminum-Gallium-Arsenide/Gallium Arsenide substrate ($Al_{0.7}Ga_{0.3}As/GaAs$). The thickness of the ferromagnetic layer 340 was during the experiments 2.0 nm (20 Å). However, as illustrated before, the ferromagnetic layer 340 may comprise thicknesses of 1 nm (10 Å) and above, for instance, 13 Å (1.3 nm) or other thicknesses depending on different parameters.

A number of explanations and theories exist as to the reason for the observed behavior. Among others, an interfacial bonding, magnesium oxide barrier height effects, quantum interference or surface effects in or at the magnesium oxide layer (due to non-perfect surfaces), localized extended states and majority-spin bulk states have been proposed as explanations for the observed behavior. Moreover, spin-orbit-coupling has also been proposed as an explanation for the observed spin dependency of the reflected electrons at the surface 330.

The experimental observations have shown so far effects of about 30% of the resulting spin-polarized current. However, depending on the experimental circumstances and other technological parameters, higher or lower spin polarization degrees may be obtainable.

Figure 4B:
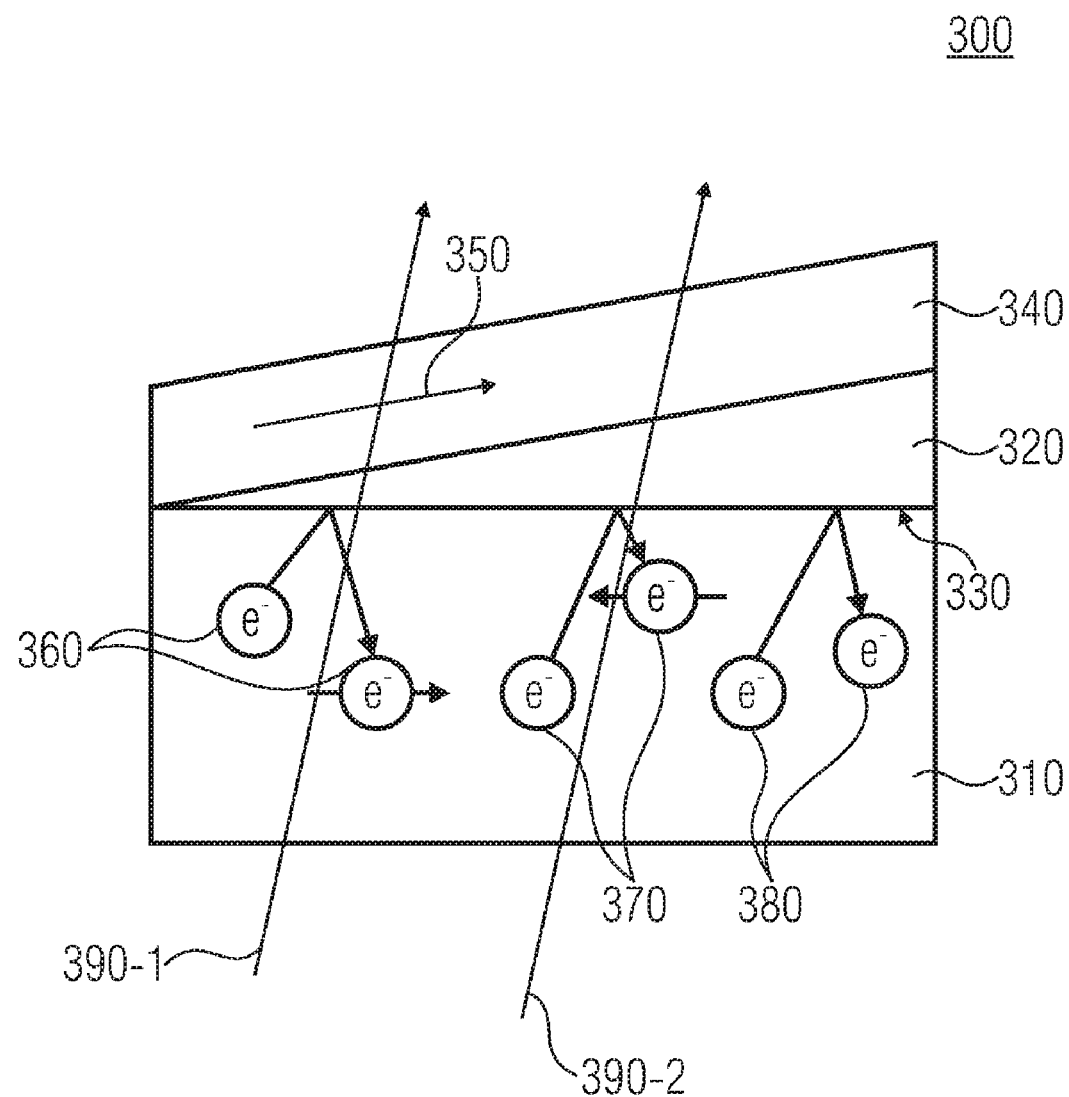

Such a simple structure with a magnesium oxide wedge 320 covering the interface 330 between the semiconductor 310 and the thin magnesium oxide layer 320, which in turn is covered by the ferromagnetic layer 340, does not allow specification of the resulting orientation of the scattered electron spins, since electrons may interact with the interface 330 at locations corresponding to different thicknesses of the oxide. For example, along a first path 390-1, as shown in FIG. 4b, scattered electrons will comprise a different spin orientation with a higher probability than along a second path 390-2, also shown in FIG. 4b. Therefore, the experimental setup as shown in FIGS. 4a and 4b, which only differ with respect to the additionally marked paths 390 from FIG. 4a, is not very suitable for an application in the framework of a spin device. FIG. 4b illustrates well that the spin orientation depends on the magnesium oxide thickness relevant for the shown individual electron paths 390-1, 390-2.

In contrast to the experimental setup shown in FIGS. 4a and 4b, using a uniform magnesium oxide layer with a constant thickness, offers the possibility of obtaining a fixed spin scattering property depending on the magnesium oxide thickness and the relevant magnetization of the ferromagnetic layer 340.

It may eventually be possible to alter the spin scattering property by applying a voltage perpendicular to the interface 330 of a stack 300, since by applying such a voltage to an electrode (not shown in FIG. 4a and 4b) may enable varying strengths of a spin-orbit coupling leading to a virtual change of the "thickness" of the insulating layer 320. Therefore, it may be possible to obtain, with a single spin selective scattering structure based on the arrangement 300 alone, two different spin polarizations, simply by adjusting a control voltage to create an electrical field perpendicular to the interface 330. In other words, it may be possible that by adjusting the control voltages supplied to the control electrode 190 of the spin device 100 shown in FIG. 1a, in case the spin selective scattering structure 170 comprises an arrangement similar to the arrangement 300 with an oxide layer 320 comprising a constant thickness and an additional insulating layer insulating the ferromagnetic material from the control electrode 190 above, to switch between different orientations or different degrees of spin polarization by simply adjusting the control voltage. In yet other words, it may be possible to switch between the two paths 390-1, 390-2 by adjusting the respective control voltage.

In a technical implementation of a spin selective scattering structure 170, the oxide layer 320 is typically deposited having a constant thickness. Typical values for the thickness in the case of a magnesium oxide layer vary between approximately 2 and 10 atomic layers, sometimes between 5 and 10 atomic layers. This will result in thicknesses between approximately 2 and 8 Å, while for thicknesses above 12 Å the effect appears to be vanishing.

In implementations of a spin device 100 according to an embodiment of the present invention, also other insulating layers instead of the oxide layer 320 comprising magnesium oxide may eventually be used. Magnesium oxide offers the possibility of a highly reproducible selective spin scattering structure and the technological process of employing magnesium oxide is well founded since magnesium oxide is, for instance, used in TMR-related fabrication processes (TMR=Tunneling Magneto-Resistance). Other materials, which may be used instead of magnesium oxide, comprise, for instance, aluminum oxide ($AlO_x$) which is frequently also used as a tunneling barrier in the case of TMR-based systems. As a further alternative, the ferromagnetic layer 340 and the oxide layer 320 may eventually be replaced by a single compound such as magnetite ($Fe_3O_4$) which is a ferromagnetic insulator. In other words, the spin selective scattering structure 170 as shown in FIGS. 1 to 3 may eventually be formed by a sufficiently thick magnetite layer.

In the following figures, several embodiments according to the present invention in the form of a spin device 100 will be shown in more detail compared to the schematic representations of the FIGS. 1 to 3. In the following figures, the spin selective scattering structure 170, which was only schematically shown in FIGS. 1 to 3, will be described in more detail. However, it should be pointed out again that the embodiments shown in FIGS. 1 to 3 may easily be implemented by implementing the spin selective scattering structure comprising a magnetite layer or another suitable structure.

Optionally, the spin selective scattering structure may comprise an additional insulating layer, for instance, a magnesium oxide layer forming the interface 180 underneath the magnetite or it may further comprise an insulating layer on top of the magnetite layer to enhance the electrical insulation to the control electrode 190 deposited on top of the spin selective scattering structure 170, in the case of a spin device 100 as shown in FIG. 1a.

FIG. 5a shows a cross-sectional view of a spin device 100 according to an embodiment of the present invention based on a FET-structure which is fairly similar to the spin device 100 shown in FIG. 1a. The spin device 100 of FIG. 5a also comprises a substrate 110 comprising an intermediate semiconductor region 120 in which a channel will be formed during operation. Accordingly, a first terminal 130 abutting the intermediate semiconductor region 120 is also referred to as a source contact. A second terminal 140, also abutting the intermediate semiconductor region 120, is therefore also referred to as a drain terminal.

The intermediate semiconductor region 120 abuts the spin selective scattering structure 170 so that an interface 180 is formed between the two. On top of the spin selective scattering structure 170, a control electrode or a gate electrode is deposited, which is electrically connected to a control contact 200 which is also referred to as the gate contact.

However, the spin device 100 of FIG. 5a differs from the spin device 100 of FIG. 1a with respect to the spin selective scattering structure 170. To be more precise, the spin selective scattering structure 170 of FIG. 5a comprises a magnesium oxide layer 400 (with a constant thickness as compared to the wedge-shape of layer 320 in FIGS. 4a and 4b) abutting the intermediate semiconductor region 120 and forming the interface 180. On top of the magnesium oxide layer 400, a ferromagnetic layer 410 is deposited. The ferromagnetic layer 410 along with the magnesium oxide layer 400 form the spin selective scattering structure 170. As laid out before, the ferromagnetic layer 410 may be an insulating layer (e.g., magnetite), a semiconducting layer (e.g., magnetically doped semiconductor) or a conductive or metallic layer (e.g., iron (Fe), nickel (Ni) or cobalt (Co)).

It should be noted that different materials may be used in different embodiments according to the present invention. For instance, the magnesium oxide layer 400 may be replaced by another electrically insulating layer. This layer may, for instance, comprise aluminum oxide ($AlO_x$), silicon dioxide ($SiO_2$), silicon oxide (SiO), a nitride (e.g., $Si_xN_y$ (with x, y indicating the stoichiometrical composition, e.g., $Si_3N_4$) or a combination thereof. In other words, in the embodiment shown in FIG. 5a, the magnesium oxide layer 400, a as a generalization, may be replaced by another insulating layer, as previously described, to obtain a spin device 100 according to a different embodiment of the present invention.

It might be advisable to electrically insulate the ferromagnetic layer 410 from the gate control 190 via an insulation layer in order to prevent influences on the ferromagnetic properties by an electrical current going into the ferromagnetic layer 410, if fabricated from a ferromagnetic metal or another ferromagnetic conductor. For instance, in the case of using iron (Fe) as the ferromagnetic layer 410, this may be advisable, but is by far not necessary. The spin device 100 comprising such an electrical insulation is shown in FIG. 5b.

FIG. 5b shows a further spin device 100 according to an embodiment of the present invention, which differs from the spin device 100 shown in FIG. 5a merely with respect to an additional gate oxide layer 420, which is arranged in between the ferromagnetic layer 410 and the control electrode 190.

The gate oxide layer 420 in between the ferromagnetic layer 410 and the gate electrode or control electrode 190 offers the possibility of adjusting the effective electrical insulation of the gate electrode 190 more independently from the electrical properties of the spin selective scattering structure 170 comprising the stack of the magnesium oxide layer 400 and the ferromagnetic layer 410.

This may eventually be advisable, since a thickness of the magnesium oxide layer 400, as well as a thickness of the ferromagnetic layer 410 may eventually be defined due to the functional properties as being part of the spin selective scattering structure 170. As a consequence, choosing the control or gate voltage to be applied to the gate electrode 190 may be limited. For instance, applying values of more than 10 V (e.g., 15 V) to the control electrode 190 may not be possible without introducing the gate oxide layer 420. In other words, by introducing the gate oxide layer 420 and, therefore, by replacing the stack of the spin selective scattering structure 170 as shown in FIG. 5a comprising the ferromagnetic layer 410 and the magnesium oxide layer 400 by the more complicated stack comprising also the gate oxide layer 420 may eventually lead to more flexible and to a more applicable spin device 100.

Depending on the perspective, the gate oxide layer 420 may well be considered to be part of the spin selective scattering structure 170. In this case, the spin selective scattering structure 170 comprises the stack of the three layers 400, 410 and 420 as previously outlined. In a further embodiment according to the present invention, based on the embodiment shown in FIG. 5b, a further gate oxide may eventually be introduced in between the magnesium oxide layer 400 and the ferromagnetic layer 410, which may eventually be advisable to strengthen the voltage resistance with respect to electrical fields applied via the control or gate electrode 190. However, depending on the concrete implementation and the circumstances, it may eventually be advisable to implement the gate oxide layer in the form of a magnetite layer (magnetite also being an oxide of iron). Typical thicknesses of the gate oxide layer 420 and of a further gate oxide layer may be chosen from typical values in the field of semiconductor processing, bearing the planned operational parameters in mind.

As a further application, the gate oxide layer 420 may be used as a tunneling barrier, when the ferromagnetic layer 410 is a conductive or metallic layer. In this case, the ferromagnetic layer 410 may be used as a floating gate electrode comparable to a flash memory device. In this case, by tunneling charge carriers from the control electrode 190 onto the ferromagnetic layer 410, a charge state of the ferromagnetic layer 410 may be changed such that the altered charge state creates an additional electrical field perpendicular to a direction 210 of the current inside the intermediate semiconductor region 120. This additional electrical field may then contribute to the electrical field perpendicular to the direction 210 of the current controlling the magnitude of the current. Hence, the spin device may be considered to be programmable by introducing a floating gate-like layer, as will be outlined in more detail below.

FIG. 6a shows a further embodiment according to the present invention of a spin device 100. The spin device 100 is based on a FET-like structure comprising a substrate 110 with an intermediate semiconductor region 120 abutting a source terminal 130 (first terminal) and a drain terminal 140 (second terminal). The spin device 100 further comprises a spin selective scattering structure 170 comprising a magnesium oxide layer 400 and a ferromagnetic layer 410 as shown in FIGS. 5a and 5b. The spin selective scattering structure 170 forms an interface 180 with the intermediate semiconductor region 120.

The spin device 100, as shown in FIG. 6a, comprises a floating gate electrode 430 on top of the ferromagnetic layer 410, which may, for instance, be fabricated from poly-silicon. The insulating layer 440 on top of the floating gate electrode 430, may for instance be formed by an oxide material or an Oxide-Nitride-Oxide layer (ONO). On top of the insulating layer 440, a control electrode or a gate electrode 190 is deposited along with a control contact 200.

By introducing the floating gate electrode 430, which is electrically insulated from the control or gate electrode 190 via the insulating layer 440, charge carriers may tunnel from the control electrode 190 onto the floating gate electrode 430, which may lead to a change of the charge state of the floating gate electrode 430. In other words, the floating gate electrode 430 may be charged or discharged via the control electrode 190 by means of tunneling through the insulating layer 440.

By changing the charge state of the floating gate electrode 430, electrostatic charges are provided to the floating gate electrode 430 which may contribute to the electrical field perpendicular to the direction 210 of the current between the first terminal 130 and the second terminal 140. As a result, it may be possible to "program" the spin device 100 by pre-charging the floating gate electrode 430 accordingly. In other words, by providing the floating gate electrode 430 with an appropriate charge, the spin device 100 may be programmed such that in the case of an implementation based on an enhancement FET, the spin device 100 may be turned on even without a control voltage to the control electrode 190. Naturally, by applying additional voltage to the control electrode 190 (either positive or negative), the magnitude of the current flowing between the first, and the second terminals 130, 140, is still controllable.

It should be noted that the ferromagnetic layer 410 may once again be an electrically conducting or an insulating layer 410. In the case of an electrically conducting ferromagnetic layer 410 (e.g., a ferromagnetic metal), the floating gate electrode 430 together with the ferromagnetic layer 410 acts as the "floating gate electrode".

Moreover, depending on the perspective as outlined in the context of FIG. 5b, the spin selective scattering structure 170 may also be considered to comprise the floating gate electrode 430, as well as the insulating layer 440.

FIG. 6b shows a further embodiment according to the present invention of a spin device 100, which is similar to the spin device 100 shown in FIG. 6a. The spin device 100 shown in FIG. 6b differs from the spin device 100 shown in FIG. 6a mainly with respect to an additional insulating layer 450 which is arranged between the ferromagnetic layer 410 and the floating gate electrode 430.

By introducing a further insulating layer 450, the ferromagnetic layer 410 is electrically insulated from the floating gate electrode 430. As a result, in the case of an electrically conducting ferromagnetic layer 410 (e.g., ferromagnetic metal) charging of the ferromagnetic layer 410 may be prevented, which may eventually lead to a disturbance of the electrical and/or magnetic properties of the layer 410.

The further insulating layer 450 may, for instance, comprise an oxide material, which may for instance be used in other semiconductor-related fabrication processes and devices as a tunnel oxide. However, other insulating materials may also be used here.

Figure 7A:
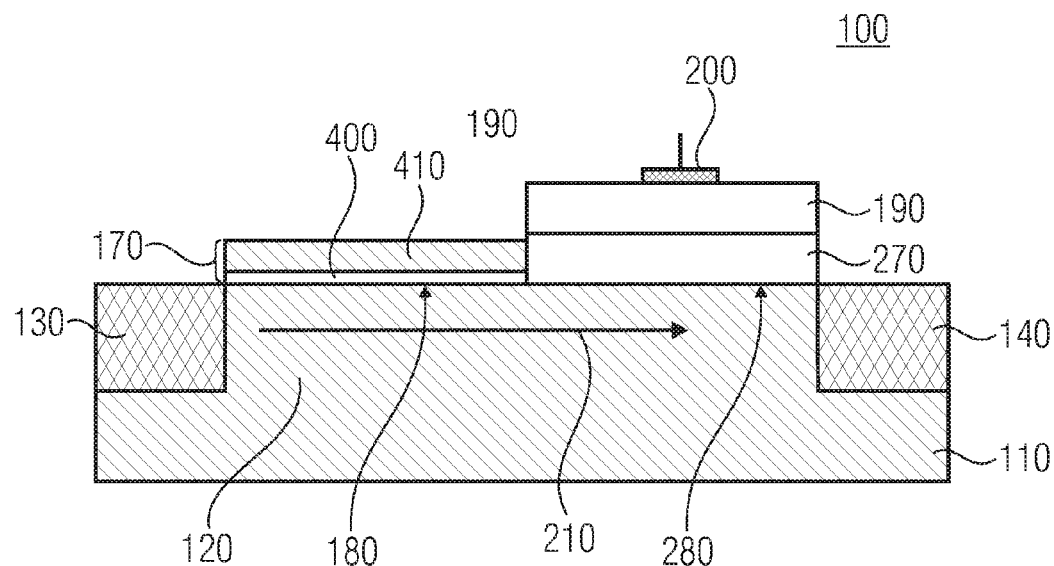
FIGS. 7a and 7b show cross-sectional views of spin devices according to an embodiment of the present invention with separated spin scattering structures and control electrodes.

FIG. 7a shows a spin device 100 according to a further embodiment of the present invention, which is similar to the embodiment shown in FIG. 3. Once again, the spin device 100 comprises laterally and geometrically decoupled components or structures for the spin selective scattering on the one hand, and controlling the magnitude of the current on the other hand. To achieve this, the intermediate semiconductor region 120 comprised in the substrate 110 forms an interface 180 with respect to the spin selective scattering structure 170 and a further interface 280 with respect to a further insulating layer 270, the control electrode 190, and the control contact 200 on the other hand. The surface of the intermediate semiconductor region 120, hence, comprises at least the interface 180 used during the spin selective scattering and the further interface 280 in the vicinity of which the control of the magnitude of the flowing current is performed.

The spin selective scattering structure 170 comprises a magnesium oxide layer 400 and a ferromagnetic layer 410, as shown in FIG. 5a. The magnesium oxide layer 400 abuts the intermediate semiconductor region 120 at least partially, so that the interface 180 is formed between the two.

The spin device 100 as shown in FIG. 7a is again a spin device based on a FET-design. As a consequence, the first terminal 130 is also referred to as a source terminal, whereas the second terminal 140 is also referred to as the drain terminal. As a result, the further insulating layer 270 is also referred to as a gate oxide (GOX), while the control electrode 190 is referred to as the gate electrode. The control contact 200 is, therefore, also referred to as the gate contact.

In the spin device 100 as shown in FIG. 7a, the current first passes the spin selective scattering structure 170 and is afterwards controlled with respect to its magnitude by the electrical field perpendicular to the direction of the current 210 by applying the corresponding gate voltage to the control electrode 190. The spin selective scattering structure 170 and the control electrode 190 form together with the further insulating layer 270 a "series connection", wherein the spin selective scattering structure 170 is coupled before the control electrode 190.

However, the order of the spin selective scattering structure 170 and the control electrode 190 is by far not mandatory. As outlined in the context of FIG. 3, the flow of the current may be equally well reversed.

Figure 7B:
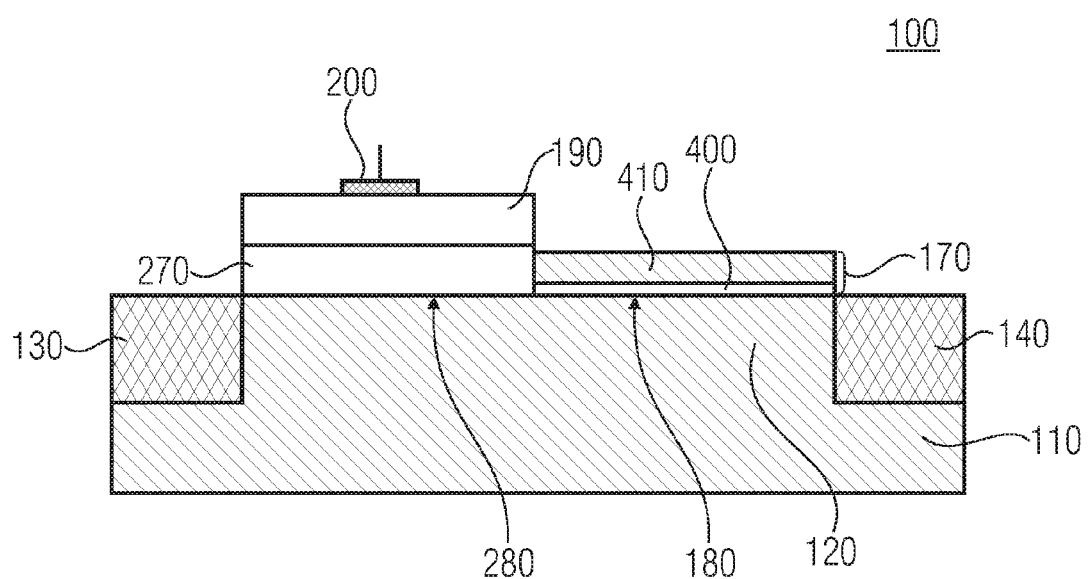

FIG. 7b shows a corresponding spin device 100 which differs from the spin device 100 shown in FIG. 7a mainly with respect to the order of the spin selective scattering structure 170 and the control electrode 190. In other words, in the case of the spin device 100 as shown in FIG. 7b, the spin selective scattering structure 170 is coupled behind the control electrode 190.

It should be noted that the spin devices 100 according to embodiments of the present invention as shown in FIGS. 7a and 7b may lack the possibility of influencing the spin orientation by applying an appropriate voltage to the spin selective scattering structure, but may therefore offer the possibility of decoupling the spin selective scattering structure 170 from the influences of the vertically applied electrical field of the control electrode 190. It may therefore be possible to reduce or even omit unwanted parasitic effects caused by the perpendicular electrical field.

Figure 8A:
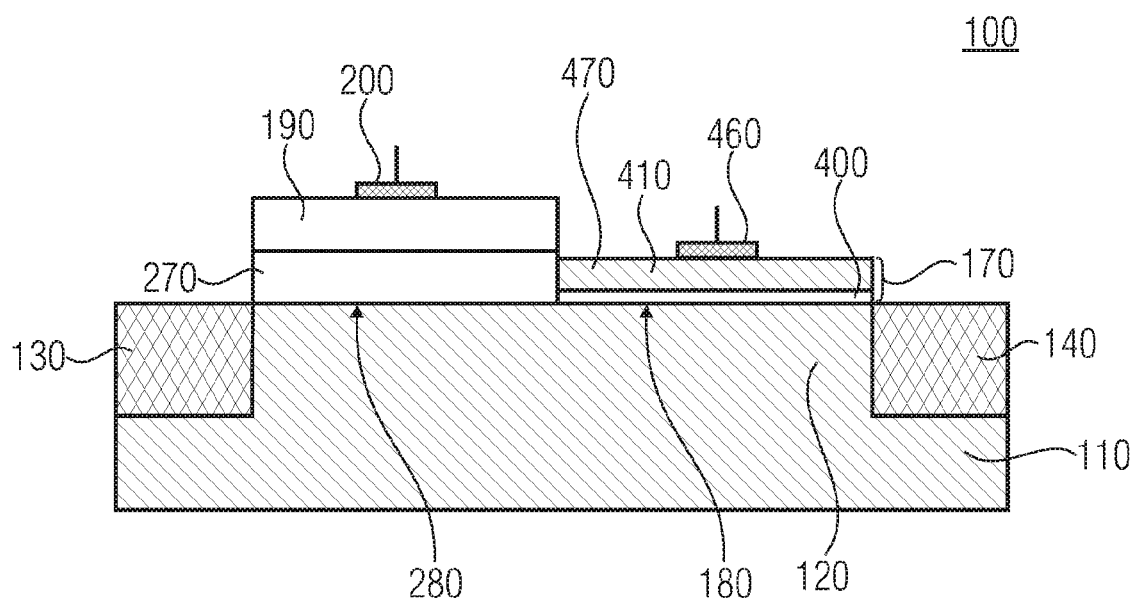
FIGS. 8a and 8b show cross-sectional views of spin devices according to an embodiment of the present invention with a biasing electrode.

FIG. 8a shows a further embodiment according to the present invention, which is similar to the spin device 100 as shown in FIG. 7b. To be more precise, the spin device 100 as shown in FIG. 8a differs only with respect to the spin selective scattering structure 170. Apart from the magnesium oxide layer 400 forming the interface 180 along with at least part of the intermediate semiconductor region 120 and the ferromagnetic layer 410, the spin selective scattering structure 170 further comprise a biasing contact 460. Therefore, the ferromagnetic layer 410 may be used as a biasing electrode 470, in the case of using a ferromagnetic conductive material (e.g., ferromagnetic metal), as the ferromagnetic layer 410.

By introducing such a biasing contact 460, the spin selective scattering properties of the spin selective scattering structure 170 may eventually be altered. By applying the corresponding voltage, the charge carriers of the current may be attracted towards the interface 180 so that the spin selective scattering properties may be enhanced by increasing the number of interactions of the charge carriers with the interface 180. As a result, it may be possible to influence the degree of spin polarization obtainable.

Figure 8B:
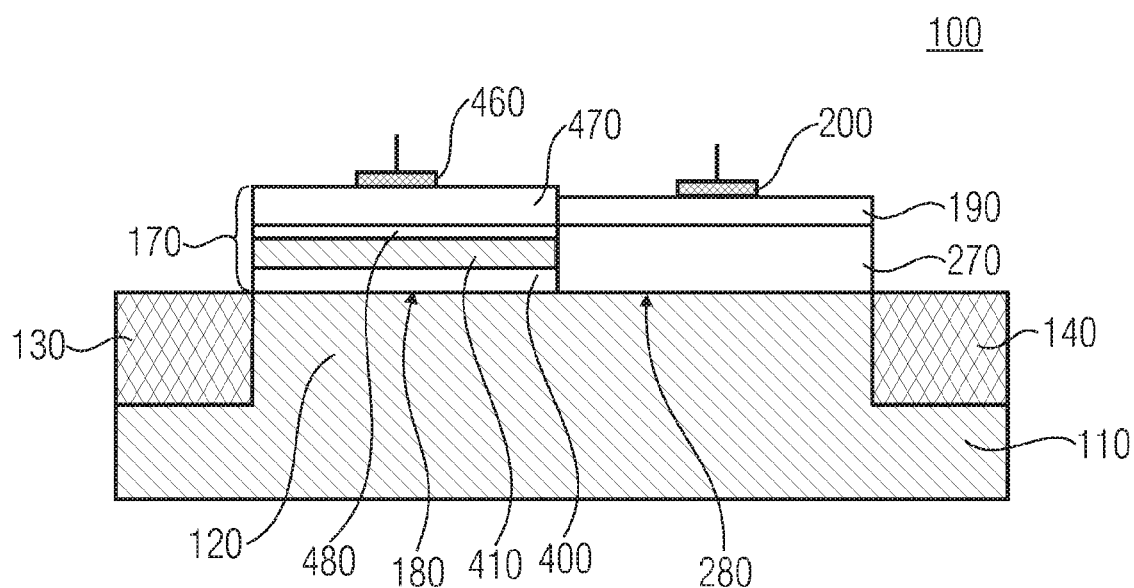

FIG. 8b shows a cross-sectional view of a further spin device 100 according to an embodiment of the present invention. The spin device 100 of FIG. 8b differs from the spin device 100 shown in FIG. 7a mainly with respect to an additional biasing electrode 470, which is electrically coupled to a biasing contact 460. The biasing electrode 470 is arranged on top of the ferromagnetic layer 410 and separated from it by an insulating layer 480 covering the ferromagnetic layer 410 at least in an area in which the biasing electrode 470 is deposited. The insulating layer 480, hence, electrically insulates the biasing electrode 470 from the ferromagnetic layer 410.

By electrically insulating the biasing electrode 470 from the ferromagnetic layer 410, it may be possible to reduce unwanted influences, which may be caused by a current flowing into the ferromagnetic layer 410 due to a direct contact of the ferromagnetic layer 410 with the biasing contact 460 as it is in the case of the spin device 100 shown in FIG. 8a. The spin device 100 of FIG. 8b may offer the possibility of applying a voltage to the biasing electrode 470 in such a way that the charge carriers of the current flowing from the first terminal 130 (source terminal) to the second terminal 140 (drain terminal) may be attracted towards the interface 180. This may lead to increasing the number of interactions of the charge carriers with the spin selective scattering structure 170 comprising not only the magnesium oxide layer 400, the ferromagnetic layer 410, but also the biasing electrode 470, the insulating layer 480 and the biasing contact 460. Hence, compared to the spin device as shown in FIG. 7a, implementing the biasing electrode 470 may once again offer the possibility of enhancing the spin polarizing defect of the spin device 100.

It should be noted for the sake of completeness that once again the direction of the current is, by far, not limited to current flowing from the first terminal 130 to the second terminal 140. The order of the spin selective scattering structure 170 and the control structure comprising the further insulating layer 270 (e.g., gate oxide) along with the control electrode 190 (gate electrode) may be reversed, not only for the spin device 100 shown in FIG. 8a, but also for the spin device 100 shown in FIG. 8b. In other words, the control electrode 190 may either be arranged before or behind the spin selective scattering structure 170.

Figure 9A:
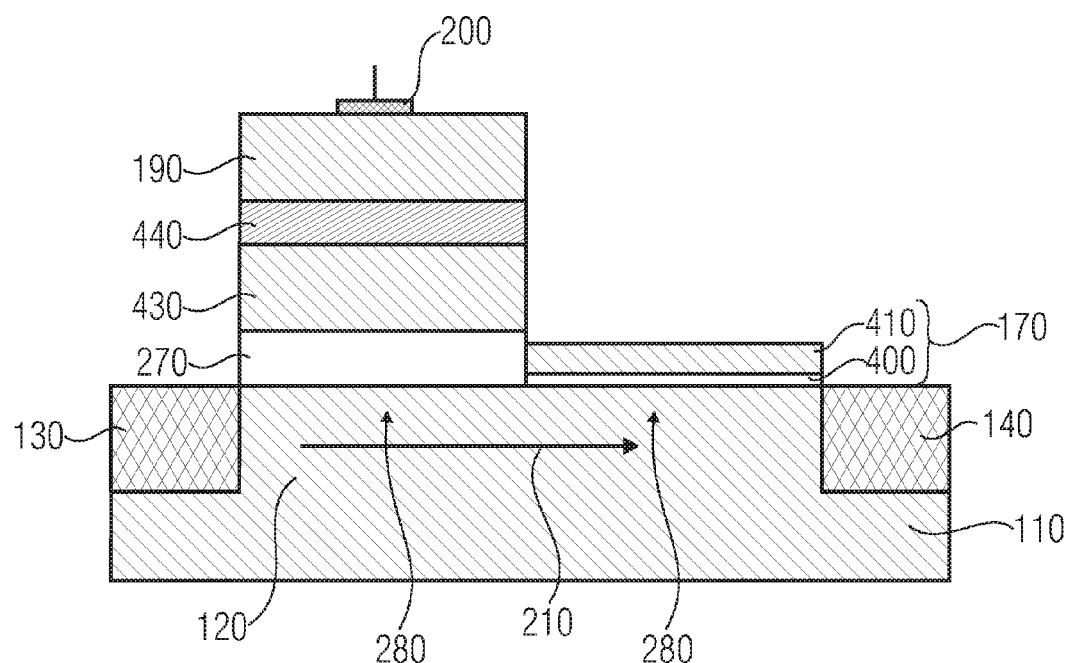
FIGS. 9a and 9b show cross-sectional views of a spin device according to an embodiment of the present invention comprising a floating gate electrode.

FIG. 9a shows a further spin device 100 according to the embodiment of the present invention with spatially and geometrically separated components concerning the spin scattering and the controlling of the magnitude of the current flowing between the first terminal 130 and the second terminal 140 of the spin device 100. The spin device 100 of FIG. 9a comprises a similar structure compared to the spin device 100 shown in FIG. 7b. It mainly differs from its counterpart in FIG. 7b with respect to the component for controlling the magnitude of the current flowing from the first terminal 130 to the second terminal 140. While the spin selective scattering structure 170 of the spin device 100 of FIG. 9a is identical to the spin selective scattering structure 170 of FIG. 7b, the spin device 100 of FIG. 9a comprises a floating gate electrode 430 and an insulating layer 440 (e.g., an oxide or ONO (Oxide-Nitride-Oxide)). As a consequence, the floating gate electrode 430, which may be fabricated from poly-silicon, is electrically insulated from the intermediate semiconductor region 120 by the further insulating layer 270 and from the control electrode 190 (control gate) by the insulating layer 440.

As already outlined in the context of FIGS. 6a and 6b, this may offer the possibility of providing an electrical charge to the floating gate electrode 430 to change its charge state, so that the charge, as on the floating gate electrode 430, generates an electrical field perpendicular to the direction 210 of the current from the first terminal 130 to the second terminal 140. This electrical field is superimposed to the perpendicular electrical field caused by charging the control electrode 190 during operation of the spin device 100. As a consequence, by charging the floating gate electrode 430, a default state of the spin device 100 may be influenced, for instance, to increase or decrease a special voltage to be applied to the control electrode 190 in order to switch on or switch off the current in the intermediate semiconductor region 120.

The floating gate electrode 430 may be charged by tunneling charge carriers from the control electrode 190 to the floating gate electrode 430 passing the insulating layer 440 or from the intermediate semiconductor region 120 passing the further insulating layer 270. Depending on the concrete implementation of the spin device 100, the further insulating layer 270 may, for instance, may also be referred to as a tunnel oxide, when the charging or discharging of the floating gate electrode 430 is accomplished via the intermediate semiconductor region 120. Applying a respective voltage to the intermediate semiconductor region 120 may, for instance, be accomplished by providing the corresponding voltage to any or to both of the terminals 130, 140.

On the other hand, the charge carriers may also tunnel onto the floating gate electrode 430 by passing the insulating layer 440 when an appropriate voltage is applied to the control electrode 190.

Figure 9B:
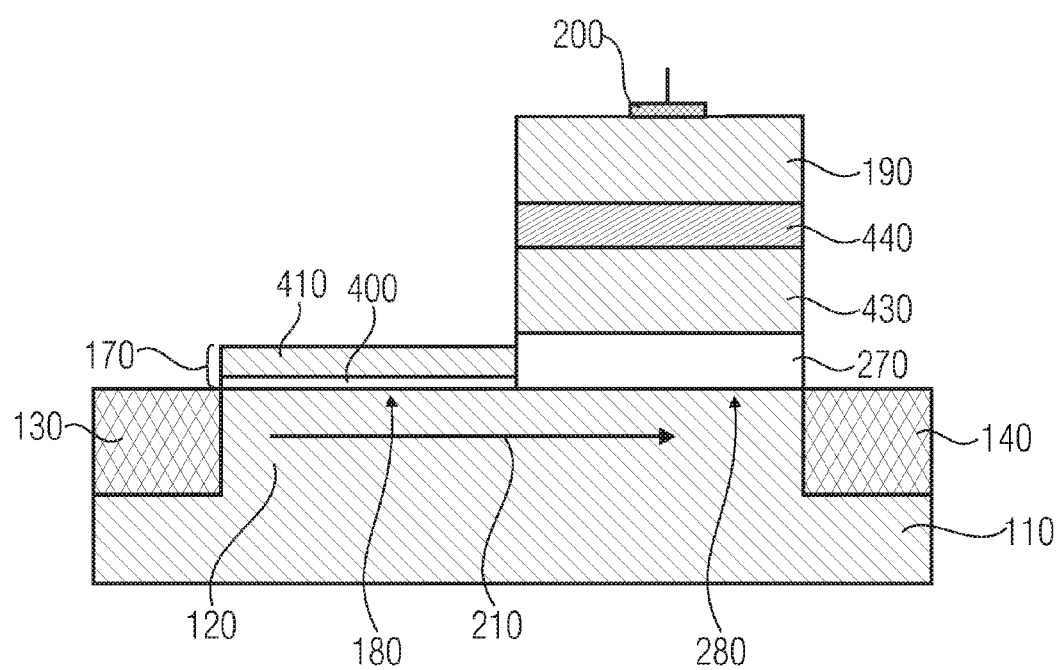

FIG. 9b shows a further embodiment according to the present invention in the form of a spin device 100, which differs from the spin device 100 of FIG. 9a mainly with respect to the order, in which the spin selective scattering structure 170 and the structure for controlling the magnitude of the current comprising the further insulating layer 270, the floating gate electrode 430, the insulating layer 440 and the control electrode 190 are arranged. In the case of the spin device 100 of FIG. 9b the structure for controlling the magnitude of the current is arranged behind the spin selective scattering structure 170 with respect to the direction 210 of the current flowing from the first terminal 130 to the second terminal 140.

Figure 10A:
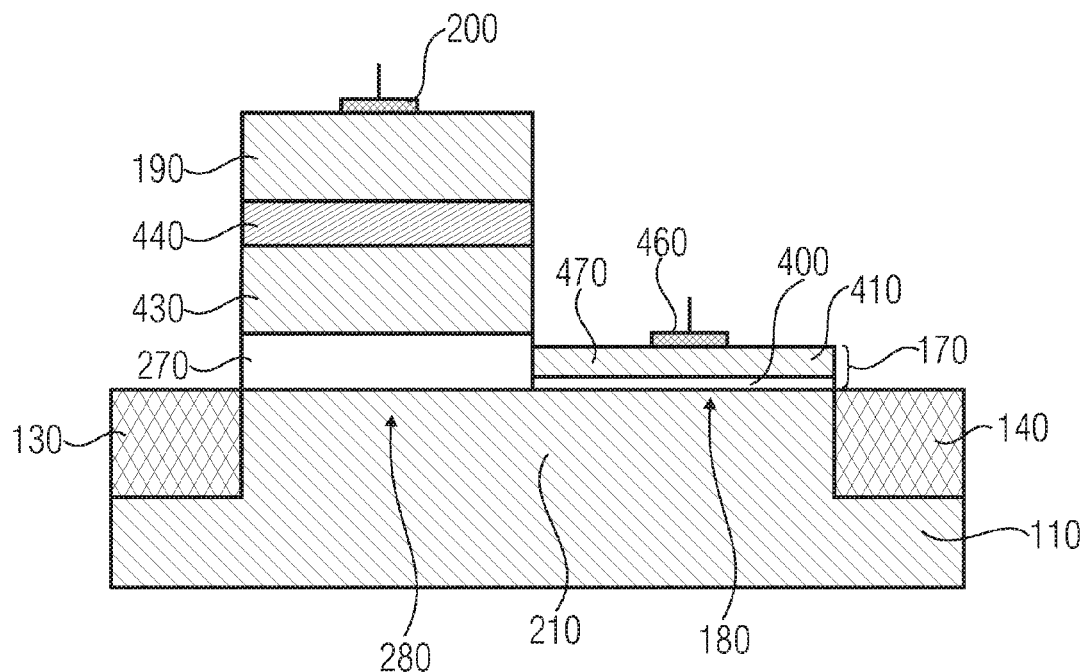
FIGS. 10a and 10b shows cross-sectional views of spin devices according to embodiments of the present invention comprising floating gate electrodes and biasing electrodes.

FIG. 10a shows a further embodiment according to the present invention in the form of the spin device 100, which is similar to the spin device 100 of FIG. 9a. The spin device 100 of FIG. 10a differs from the spin device 100 of FIG. 9a with respect to the spin selective structure 170 comprising a biasing contact 460, which allows providing a biasing voltage to the ferromagnetic layer 410 to increase the number of interactions of charge carriers in the intermediate semiconductor region 120 with the interface 180. As outlined in the context of FIGS. 8a and 8b, this may result in an increased number of interactions since the charge carriers are attracted towards the interface 180 so that the degree of spin polarized charge carriers of the current may be increased compared to the spin device 100 shown in FIG. 9a. As a consequence, the ferromagnetic layer 410 may be used as a biasing electrode 470 in the case that the ferromagnetic layer 410 is a conducting layer (e.g., a metallic layer).

Apart from that, the spin device 100 also comprises the floating gate electrode 430, which may be charged via the insulating layer 440 electrically insulating the control electrode 190 from the floating gate electrode 430 or via the further insulating layer 270 (e.g., tunnel oxide) insulating the floating gate electrode 430 from the intermediate semiconductor region 120.

Figure 10B:
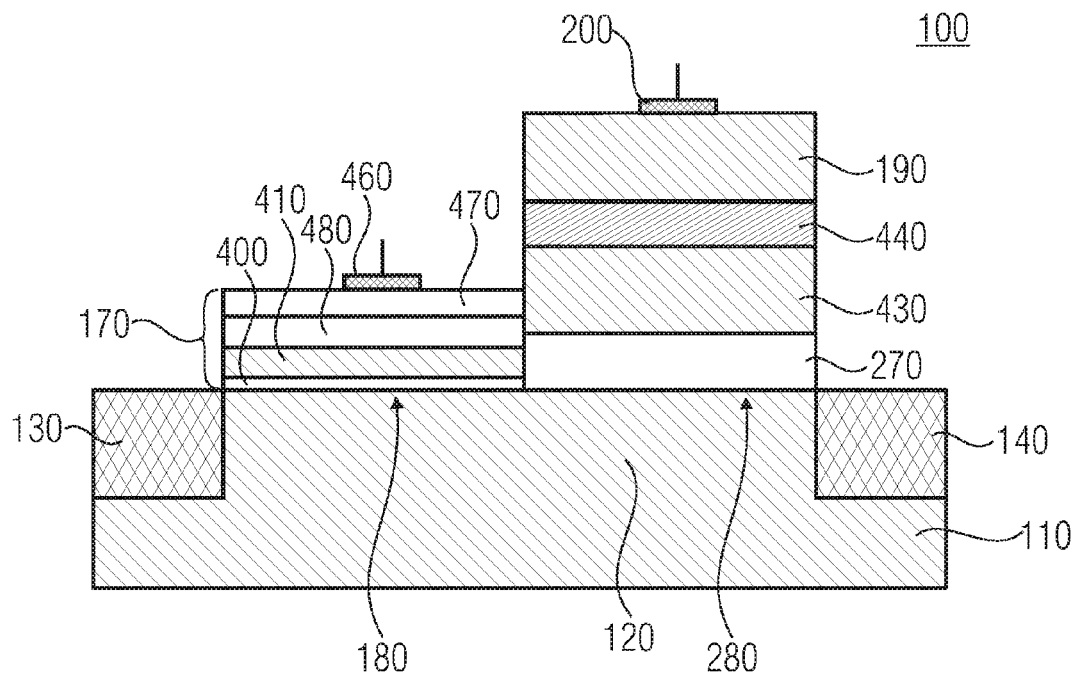

FIG. 10b shows a further spin device 100 according to an embodiment of the present invention, which is similar to the spin device 100 of FIG. 9b with respect to the structure comprising the control electrode 190, the insulating layer 440, the floating gate electrode 430 and the further insulating layer 270 as well as the reversed current direction compared to the spin device 100 shown in FIG. 10a. However, with respect to the spin selective scattering structure 170, the spin device 100 further comprises a separately implemented biasing electrode 470, which is electrically insulated from the ferromagnetic layer 410 by an insulating layer 480 deposited in between the two previously mentioned layers. The biasing electrode 470 may be then electrically coupled via a biasing contact 460 to further circuits or structures.

As outlined before in the context of FIG. 8b, the insulating layer 480 is not required to cover the whole ferromagnetic layer 410 with only the region over which the biasing electrode 470 is deposited. Apart from preventing unwanted influences on the ferromagnetic layer 410, using a separate biasing electrode 470 may also be advisable in case the ferromagnetic layer is an insulating layer (e.g., magnetite). Eventually, the insulating layer 480 may be omitted in such a case.

FIGS. 11a and 11b show a top view of a spin device 100 implemented as a lateral device according to an embodiment of the present invention, while FIG. 11c shows a cross-sectional view along a line 250 indicated in FIG. 11b through the device. The spin device 100 comprises a more complex structure compared to the previously described spin devices 100 in FIGS. 5 to 10. As a result, the spin device 100 shown in FIG. 11 will be described with references to the three FIGS. 11a, 11b and 11c at the same time.

The spin device 100, once again, comprises an intermediate semiconductor region 120 comprised in a substrate 110. The substrate 110 may, for instance, comprise silicon (Si) or may be a silicon substrate. The intermediate semiconductor region 120 abuts the first terminal 130 (source terminal) and the second terminal 140 (drain terminal) which are aligned with the intermediate semiconductor region 120 along a horizontally extending direction in FIG. 11a. The contact for the control electrodes, which are not shown in FIGS. 11a and 11b, extend along a line perpendicular to the horizontal orientation indicated by arrows 800. As a consequence, the cross-sectional view of FIG. 11c shows the control electrode 190, but does not show the first and second terminals 130, 140 since the line 250 of the direction of the cross-sectional view of FIG. 11c does not cross any of the two terminals 130, 140.

The cross-sectional view of FIG. 11c shows that the intermediate semiconductor region 120 is formed as a mesa structure with two sidewalls and a top surface. A magnesium oxide layer 400, which is comprised in the spin selective scattering structure 170 (not labeled as such in FIG. 11c) so that along both sidewalls and the top wall, interfaces 180 are formed by the deposited magnesium oxide layer 400. The magnesium oxide layer 400 is, in turn, covered by a ferromagnetic layer 410, which, in turn, is covered by a gate oxide layer 420. As a consequence, both sidewalls and the top surface of the mesa-like structured intermediate semiconductor region 120 are covered by a stack comprising the sequence of a magnesium oxide layer 400, a ferromagnetic layer 410 and a gate oxide layer 420, such that the magnesium oxide layer 400 forms with the sidewalls and the top surface of the intermediate semiconductor region 120 and interfaces 180.

As outlined before, the ferromagnetic layer 410 may comprise any of the previously mentioned ferromagnetic materials. In other words, the ferromagnetic layer 410 may either be a conductive or metallic ferromagnetic layer as well as a semi-conducting or insulating ferromagnetic layer.

On top of the gate oxide layer 420, a control electrode 190 is deposited. FIG. 11c shows the case that only the top surface of the mesa-structured intermediate semiconductor region 120 is covered, at least partially, by the control electrode 190. However, in different embodiments according to the present invention, which is schematically illustrated in FIG. 11c by dashed lines, the control electrode 190 may also cover a larger portion of the top surface of the intermediate semiconductor region 120 and/or partially or completely one or more sidewalls of the intermediate semiconductor region 120. As a consequence, in the case of a spin device 100 in the lateral design, up to three channel regions may be formed inside the intermediate semiconductor region 120 close to the interfaces 180 at the respective sidewalls and the top surface.

Naturally, embodiments according to the present invention in the form of the spin device 100 on the basis of the design shown in FIG. 11 may also comprise biasing electrodes or floating gate electrodes, which may be electrically insulated or in electrical contact with the ferromagnetic layer 410, depending on certain design and operational parameters.

Therefore, spin devices 100 according to embodiments of the present invention may also comprise more complex gate stacks.

FIG. 12*a* and FIG. 12*b* show a spin device 100 in the form of a lateral device as already described in context with FIG. 11 with multiple structures. The spin device 100, as shown in FIGS. 12*a* and 12*b*, comprises two separate intermediate semiconductor regions 120-1, 120-2, which abut each a first terminal 130-1, 130-2 and a second terminal 140-1, 140-2.

Similar to the lateral device shown in FIG. 11, the control electrodes 190, which are not shown in FIG. 12*a*, are connected along a line perpendicular with respect to a line interconnecting the first and second terminals 130, 140 of each of the two parallel-shunted intermediate semiconductor regions 120. This line is also indicated by the arrows 800 shown in FIG. 12*a*.

To simplify the description of the spin device 100 as shown in FIG. 12*a*, a line 250 is shown in FIG. 12*a*, which indicates a direction along which FIG. 12*b* shows a corresponding cross-sectional view through the spin device 100.

The cross-sectional view of the spin device 100 illustrates that the two intermediate semiconductor regions 120-1, 120-2 are based on a substrate 110 and comprise mesa forms each. The substrate 110 may, for instance, comprise silicon or may be a silicon substrate. Each of the two mesa structures, therefore, comprise two sidewalls and a top surface each.

The sidewalls and the top surface of the first intermediate semiconductor region 120-1 are covered completely in the embodiment shown in FIG. 12*b* by a first spin selective scattering structure 170-1. The first spin selective scattering structure 170-1 comprises a first magnesium oxide layer 400-1 and a first ferromagnetic layer 410-1, which are deposited onto the mesa structure of the intermediate semiconductor region 120-1 such that along the sidewalls and along the top surface, three interfaces 180-1 are formed. Accordingly, the second intermediate semiconductor region 120-2 is also covered by a second spin selective scattering structure 170-2 comprising a second magnesium oxide layer 400-2 and a second ferromagnetic layer 410-2, which are deposited onto the mesa-structure of the second semiconductor region 120-2 such that the second magnesium oxide layer 400-2 forms three interfaces 180-2 along the sidewalls and the top surface.

The first and second spin selective scattering structures 170-1, 170-2 are then covered by a common or two distinct gate oxide layers 420 that provide a lateral insulation of the ferromagnetic layers 410-1, 410-2 with respect to control electrodes 190-1, 190-2, which are deposited on top of the top surface of the corresponding intermediate semiconductor regions 120-1, 120-2, respectively.

In the case of the FET-based implementation of the spin device 100 shown in FIG. 12*a* and FIG. 12*b*, by applying corresponding control voltages to the two control electrodes 190-1, 190-2, channel regions or channels may be formed during operation in the vicinity of the interfaces 180-1, 180-2 at the top surfaces of the mesas 120-1, 120-2.

However, the spin device 100 may not just be a parallel implementation of two of the spin devices 100 as shown in FIG. 11*a*, but the individual structures of the spin device 100 may differ from one another. For instance, the spin selective scattering structures 170-1, 170-2 may be adapted such that the two provide charge carriers having different preferable spin orientations. In the case of spin selective scattering structures 170 comprising a magnesium oxide layer 400 and a ferromagnetic layer 410 as schematically depicted in FIG. 12*b*, this may be achieved by implementing the magnesium oxide layers with a different thickness as outlined in the context of FIG. 4.

Based on the results previously described, the magnesium oxide layer 400-1 of the first spin selective scattering structure 170-1 may, for instance, comprise a thickness of 0.2 nm (2 Å), while the magnesium oxide layer 400-2 of the second spin selective scattering structure 170-2 may, for instance, comprise a thickness of approximately 0.7 nm to 0.8 nm (7 Å to 8 Å). Naturally, implementing the spin selective scattering structures 170-1, 170-2 in the described manner is, by far, not required. In principle, implementing the spin selective scattering structures with the same magnesium oxide layer thickness may also be realized in embodiments according to the present invention.

As already outlined in the context of FIG. 11, FIG. 12 shows a spin device with a fairly simply top gate stack. One or both stacks provided on top of the intermediate semiconductor regions 120-1, 120-2 may furthermore comprise a floating gate electrode, additional insulating layers, a biasing electrode or other additional layers as previously described.

As the previous description of the spin device 100 shown in FIG. 12 has shown, embodiments according to the present invention may be implemented in such a way that a predetermined or "fixed" spin-scattering property may result from the thickness of the magnesium oxide layer 400 of the respective spin selective scattering structure 170 only. Since it is possible to achieve different spin polarization orientations based on varying the thickness of the magnesium layer 400 alone without changing a magnetization orientation of the ferromagnetic layer 410 deposited on top of the magnesium oxide layer 400, embodiments according to the present invention, as shown in FIG. 12, may be used as a spin injector for injecting a current with a spin polarization, which is different from an unpolarized current. Moreover, by using a spin device 100 in the described fashion with two different spin selective scattering structures 170, a switching between different spin orientations may be possible without altering a common magnetization or orientation of the ferromagnetic layers 410 involved.

Therefore, embodiments according to the present invention may provide a selective spin injection, which may be controlled via a control electrode (gate electrode) providing two different spin directions, while having only one effective magnetization or direction of the magnetic field active on the device. This may become important in highly integrated circuits, where different structures of the spin device 100 as shown in FIG. 12 or different spin devices 100 are arranged closely to one another on the same chip or die. In this case, by employing embodiments according to the present invention, the ferromagnetic layers 410 of the spin selective scattering structures 170 may be used having a common orientation or a common magnetization direction. Compared to a solution, which requires different magnetizations or different directions of magnetizations for different spin injectors, embodiments according to the present invention may significantly reduce unwanted, parasitic interferences between the different ferromagnetic layers.

Moreover, as the description of the previously mentioned embodiments have already shown, by using an insulation layer as a tunnel barrier between the control electrode, the ferromagnetic material or a floating gate electrode, it may be possible to use the spin device 100 in the mode of operation as a spin injector, as a storage element, which provides, upon addressing (e.g., applying a voltage to the first and second terminals 130, 140), a current with a predetermined spin polarization. It may therefore be possible to use the spin device 100 according to an embodiment of the present invention also as a storage element for a spintronics application.

As the description of the embodiments according to the present invention shown in FIG. 12a has already shown, the above-mentioned effects, challenges and demands may be fulfilled by a spin device according to an embodiment of the present invention that, for instance, comprise to individual metal-magnesium oxide-semiconductor (drift). Each of these devices may employ a first terminal (source region, source contact) and a second terminal (drain region, drain contact), as well as some gate contact on top of the magnesium oxide layer with a defined thickness in between the two previously mentioned terminals.

Figure 13A:
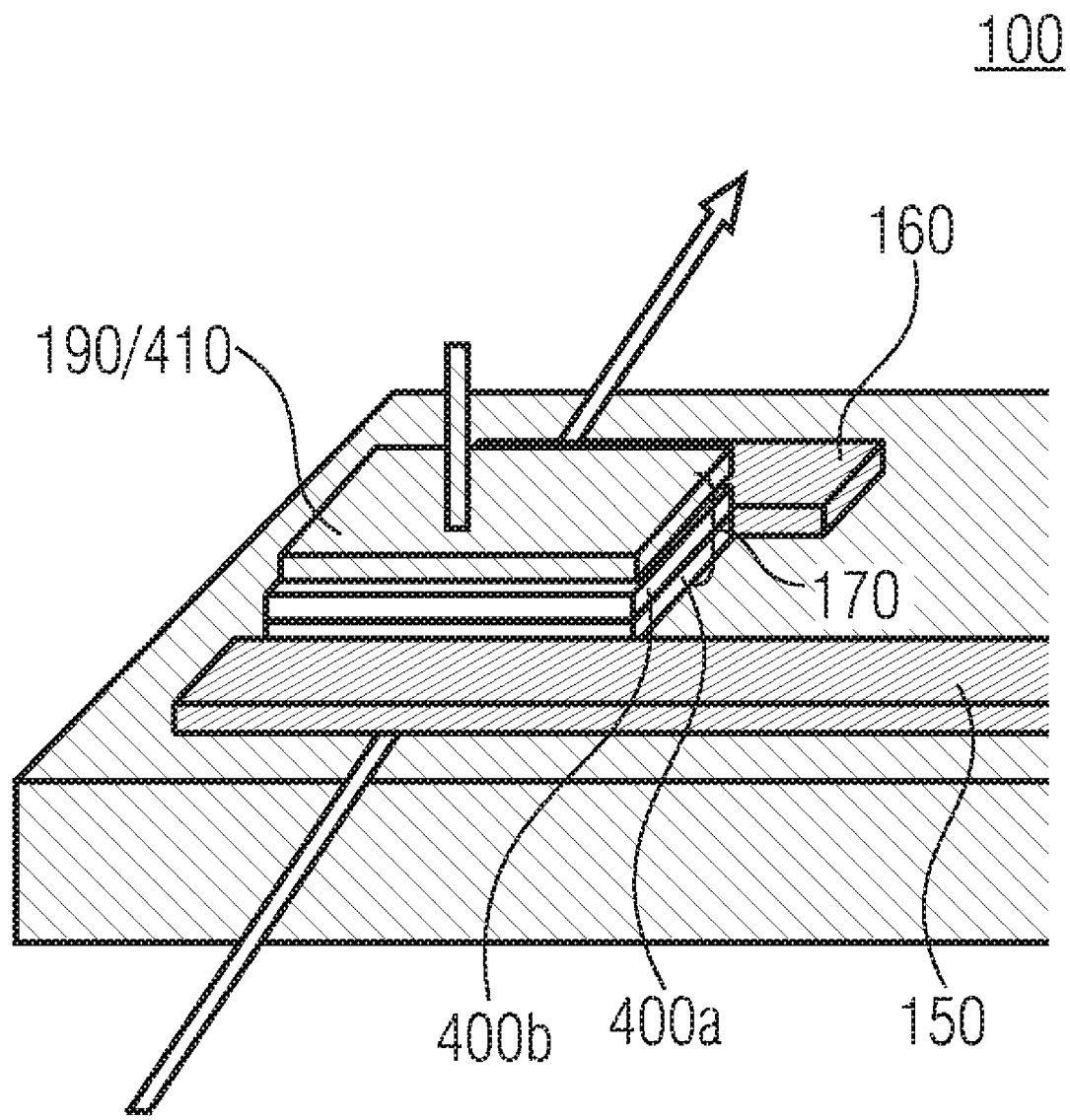
FIG. 13a shows schematically in perspective a spin device according to an embodiment of the present invention with one spin injector.

FIG. 13a shows a perspective illustration of a spin device 100 comprising a first contact 150 (source metal contact), a control electrode 190 (gate electrode) and a second contact 160 (drain metal contact). For the sake of simplicity only, the terminals as well as the intermediate semiconductor regions are not shown in FIG. 13a.

Between the first contact 150 and the second contact 160 a spin selective scattering structure 170 is arranged. To be more specific, in-between the first contact 150 and the second contact 160, the spin-scattering structure 170 is located, which comprises a first magnesium oxide layer 400a directly in contact with the semiconductor substrate 110 to form the interface 180 (not shown in FIG. 13a), an optional second magnesium oxide layer 400b and a ferromagnetic layer 410, which is also adapted to operate as the respective control electrode 190. It should be noted that the second magnesium oxide layer 400b is optional and may be, hence, omitted if appropriate. It is not required to be present.

Figure 13B:
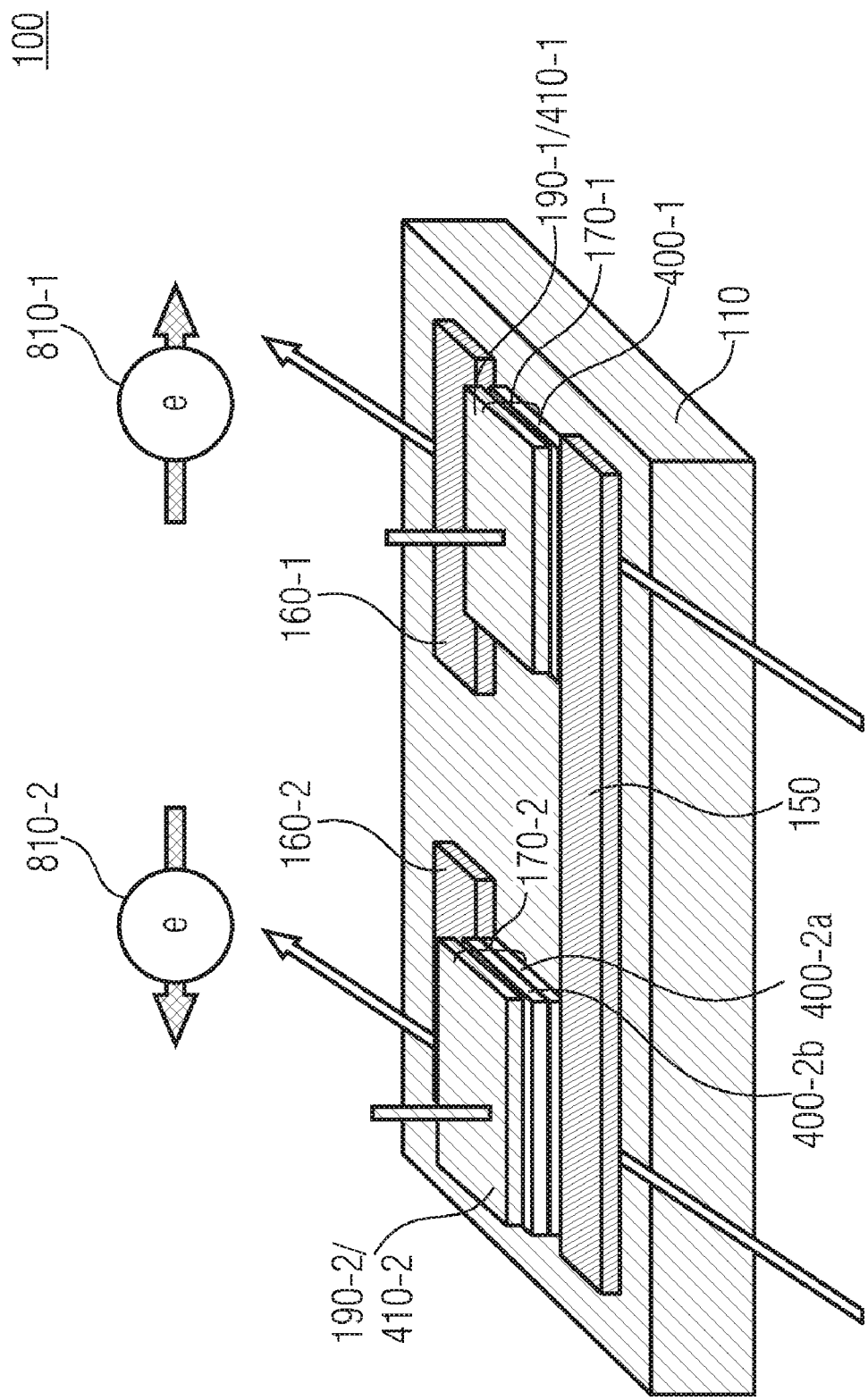
FIG. 13b shows schematically in perspective a spin device according to an embodiment of the present invention with two spin injectors.

Concerning possible choices for materials and other related properties and features, reference is made to the description of the spin device 100 shown in FIG. 13b. A possible mode of operation will also be described in the context of FIG. 13b.

FIG. 13b shows a perspective illustration of a proposed spin device 100 comprising a common first contact 150 (source metal contact), two control electrodes 190-1, 190-2 (gate electrodes 1 and 2) and two second contacts 160-1, 160-2 (drain metal contacts). For the sake of simplicity only, the terminals as well as the intermediate semiconductor regions are not shown in FIG. 13b.

Between the common first contact 150 and each of the two second contacts 160-1, 160-2, spin selective scattering structures 170 are arranged. To be more specific, in-between the first contact 150 and the second contact 160-1, a first spin-scattering structure 170-1 is located, which comprises a magnesium oxide layer 400-1 directly in contact with the semiconductor substrate 110 to form the interface 180 (not shown in FIG. 13b) and a ferromagnetic layer 410-1, which is also adapted to operate as the respective control electrode 190-1.

A second spin selective scattering structure 170-2 is located in between the first contact 150 and the second contact 160-2. In addition, the second spin selective scattering structure 170-2 comprises a ferromagnetic layer 410-2, which is adapted to operate as the control electrode 190-2 of the respective structure. However, different from the first spin selective scattering structure 170-1, the second spin selective scattering structure 170-2 comprises two magnesium oxide layers 400-2a, 400-2b, wherein the magnesium oxide layer 400-2a abuts the intermediate semiconductor region 120 (not shown in FIG. 13b) to form the corresponding interface 180 (not shown in FIG. 13b). The magnesium oxide layer 400-2b is located in-between the magnesium oxide layer 400-2a and the ferromagnetic layer 410-2.

The spin device 100 shown in FIG. 13b is based on employing a metallic ferromagnetic layer 410-1, 410-2, which is capable of also operating as the gate electrode or control electrode 190-1, 190-2. Moreover, as indicated above, the common first contact 150 as well as the two second contacts 160-1, 160-2 are implemented as metallic contacts, for instance, comprising aluminum (Al), copper (Cu), titanium (Ti), tungsten (W), tantalum (Ta), gold (Au), silver (Ag) or other metals and alloys. In different embodiments according to the present invention, the first and second contacts 150, 160 as well as other as metallic components described structures may also be implemented based on a silicide (e.g., binary chemical compounds comprising silicon (Si), e.g., $TiSi_2$).

The first and the second spin selective scattering structures 170-1, 170-2 along with the respective gate electrodes 190-1, 190-2 comprise different thicknesses of the magnesium oxide layers in such a way that electrons or other charge carriers with different spin orientations are scattered differently. While the magnesium oxide layer 400-1 and the magnesium oxide layer 400-2a may, for instance, be fabricated during the same fabrication process steps having the same thickness, the magnesium oxide layer 400-2b, which is deposited onto the magnesium oxide layer 400-2a is only deposited in the framework of forming the second spin selective scattering structure 170-2.

To achieve the previously described different spin scattering properties, which are also indicated by the schematically-illustrated electrons 810-1, 810-2 in FIG. 13b, the magnesium oxide layers 400-1, 400-2a may, for instance, comprise a thickness of 3 atomic layers or monolayers. In contrast, the magnesium oxide layer 400-2b comprised in the second spin selective scattering structure 170-2 may comprise a thickness of 5 monolayers or atomic layers.

Naturally, although in the embodiment shown in FIG. 13b the ferromagnetic layers 410-1, 410-2 are adapted to directly work as the control or gate electrodes 190-1, 190-2, also more complex gate stacks may, once again, be employed comprising for instance additional insulating layers.

Considering the operation of the spin device 100 as shown in FIG. 13b, it is possible to address a path for the charge carriers (e.g., the electrons 810) by addressing either of the two shown metal-magnesium oxide-semiconductor structures by supplying appropriate control voltages to the control electrodes 190-1, 190-2. It is therefore possible to turn off the spin device 100 by supplying a corresponding voltage to both control electrodes 190 to provide an unpolarized current by providing the control electrodes 190 with voltages such that at the second contacts 160-1, 160-2, currents of equal magnitude and equal degree, but opposite spin orientation, are provided. Moreover, control voltages may be applied to the control electrodes 190-1, 190-2 that enable the spin device 100 to provide a current with a controllable magnitude and a controllable degree of spin polarization up to a value achievable by a single spin selective scattering structure 170.

For instance, in the case of a spin device 100 based on silicon with its very long spin-diffusion length of up to several centimeters, it is possible not only to couple the first terminals (not shown in FIG. 13b) of the two structures together, but also the second terminals (not shown in FIG. 13b). By doing so, it may be possible to achieve inside the semiconductor substrate 110, a spin-polarized current with a controllable magnitude and a controllable degree of spin polarization. Such a current may then be further processed or influenced by further spintronic-related devices.

Of course, apart from the mentioned magnesium oxide insulating layers, materials other than magnesium oxide may be used instead provided such materials have similar spin scattering properties. Furthermore, in case the spin scattering properties of the spin selective scattering structures 170 may be adjusted by applying voltages to the control electrode or a bias electrode, an embodiment similar to the one shown in FIG. 13b may also be realized based on a single, individual metal-magnesium oxide-semiconductor device. Naturally spin devices 100 according to embodiments of the present invention may be based on a combination of more than two such spin devices 100 as well.

Figure 14:
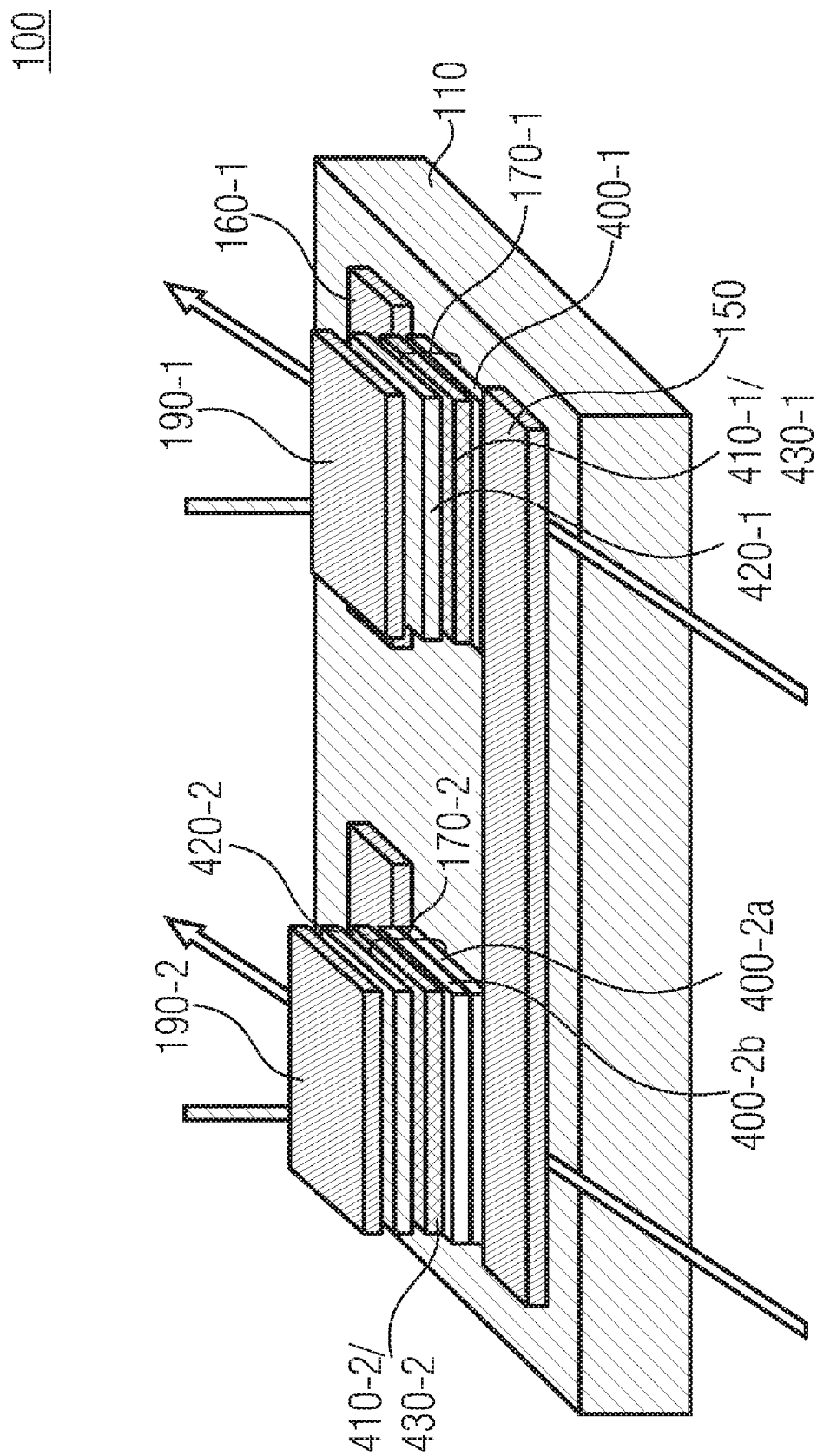
FIG. 14 shows schematically in perspective a spin device comprising floating gate electrodes according to an embodiment of the present invention.

FIG. 14 shows a further spin device 100 according to an embodiment of the present invention, which is similar to the spin device 100 shown in FIG. 13b. The proposed spin device structure as shown in FIG. 14 differs, however, with respect to the control electrodes (gate contacts), which are electrically insulated from the ferromagnetic layers 410-2 by means of tunnel oxide barrier 420-1, 420-2.

In other words, on top of the previously described selective spin-scattering structures 170-1, 170-2, an insulating layer 420-1, 420-2 are deposited, respectively, on top of which the control electrodes 190-1, 190-2 are formed. As a consequence, it is possible to use the ferromagnetic layers 410-1, 410-2 as floating gate electrodes 430-1, 430-2 to achieve the previously described programmability, since the spin device 100 shown in FIG. 14 may offer the benefit in form of the option to use the ferromagnetic layers 410-1, 410-2 as electron storage elements similar to poly-silicon layers in flash storage cells. Hence, such a spin device 100 comprising such a device structure may offer programmable and/or a switchable spin injector that can be operated in "off", "on", "spin-up" or "spin-down" modes, to name but a few. In addition, the previously described mode of operation in which the degree of spin polarization may be controllable, may be implemented accordingly.

Moreover, the spin device 100 as shown in FIG. 14 may also be used in the case of weakly conducting or non-conducting ferromagnetic materials for the ferromagnetic layers 410-1, 410-2. In this case, the ferromagnetic layers may not be usable as floating gate electrodes 430 as denoted in FIG. 14. However, due to the fact that the control electrodes 190 are still electrically insulated from the ferromagnetic layers by the tunneling oxides or gate oxide layers 420-1, 420-2, a negative influence caused by the electrical charges provided to the control electrode 190 by applying a corresponding control voltage on the ferromagnetic layers 410-1, 410-2 may be prevented.

It should be noted that the figures presented so far represent simplified illustrations of embodiments according to the present invention, which are intended to facilitate a better understanding of the great variety of possible spin devices 100 according to embodiments of the present invention. However, these simplified illustrations may comprise inaccuracies such as illustrations of layer thickness and lateral dimensions, which are not to scale when compared to real-life implementations.

Moreover, it may be possible in some real-life implementations according to embodiments of the present invention that layers, such as insulating layers, may cover a wider or a smaller range than depicted in the figures. It may also be possible that some of the layers differ in terms of their extensions from the figures. To name an example, it may be possible to limit the extension of the control electrodes 190 to a smaller area compared to the extensions of the spin selective scattering structures 170.

It should also be pointed out that the contacts as shown in the figures are not required to be implemented. In other words, the contacts may, for instance, be omitted when the respective terminals (first terminals, second terminals) are directly connected to further semi-conductive devices. The contacts (e.g., first contacts, second contacts, control contacts) may be implemented on the basis of semi-conductive materials, metals or other conductive elements, compounds and materials.

While in the previous sections of the specification the focus was mainly on generating spin-polarized current, the spin devices 100 according to embodiments of the present invention may also be used as spin detectors or detectors for determining a spin polarization. Since all the spin devices 100 described so far are based on the presence of spin selective scattering structures 170, which provide differing scattering cross sections for charge carriers with different spin polarizations, single spin devices 100 as well as more complex circuitries comprising one or more spin devices 100 may be used as spin detectors.

Due to the different cross sections for scattering charge carriers depending on their spin orientation, the spin devices 100 may comprise changing resistance values depending on the spin polarization and/or the degree of spin polarization of a current provided to the first terminal of these devices.

Without providing a feedback signal or a control signal to the control electrodes 190 of the spin devices 100, a single spin device 100 may be used to detect the spin polarization of a current by measuring its resistance value.

Figure 15A:
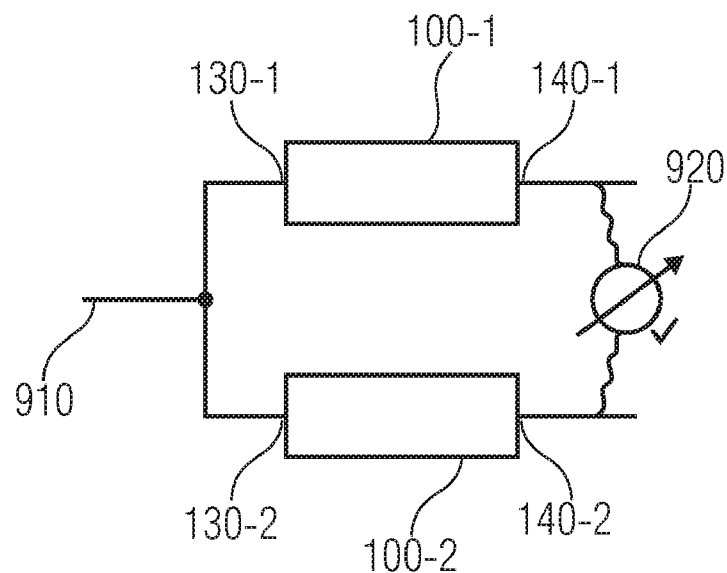
FIGS. 15a and 15b show simplified block diagrams of spin devices according to embodiments of the present invention used as a detector for detecting a spin polarization.

A further spin detector 900 according to an embodiment of the present invention employing two spin devices 100-1, 100-2 is schematically shown in FIG. 15a. The spin detector 900 comprises an input 910, to which the current, the spin polarization of which is to be detected, is provided. The input 910 is coupled in parallel to the two spin devices 100-1, 100-2, which are coupled with their first terminals 130-1, 130-2 to the input 910. A high input impedance voltmeter 920 or a high input impedance electrometer 920 is coupled to the second terminals 140-1, 140-2 of the two spin devices 100-1, 100-2.

The two spin devices 100-1, 100-2 are adapted to provide different spin polarizations. For instance, the spin device 100-1 may be adapted to provide charge carriers, when operated as a spin injector, with the opposite spin orientation compared to the spin device 100-2. As a consequence, the two spin devices 100-1, 100-2 will scatter charge carriers provided to their first terminals 130-1, 130-2 differently.

Due to these different scattering cross sections for the different spin polarizations of the charge carriers provided to the two different spin devices 100-1, 100-2, at the second terminals 140-1, 140-2 of the spin devices 100-1, 100-2, different electro-chemical potentials may be present. The difference between the two different electro-chemical potentials may then be detected by the high input impedance voltmeter 920. Therefore, a voltage difference between the two second terminals 140-1, 140-2 of the two spin devices 100-1, 100-2 represents a measure for the spin polarization of the current originally provided to the two first terminals 130-1, 130-2.

Figure 15B:
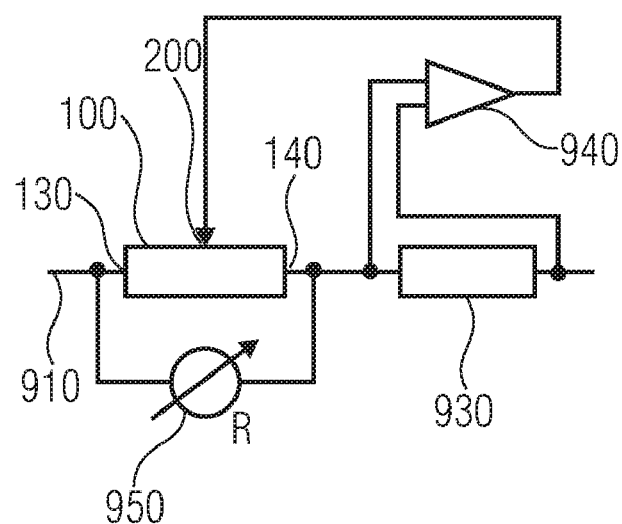

FIG. 15b shows a further spin detector 900' according to an embodiment of the present invention with an input 910. However, in contrast to the spin detector 900 shown in FIG. 15a, the spin detector 900' comprises a single spin device 100, which is coupled, with its first terminal 130, to the input 910. The spin detector 900' further comprises an Ohmic resistor 930, which is coupled in series with a second terminal 140 of the spin device 100. A differential amplifier 940 is coupled with its inputs to the two terminals of the resistor 930 and, with an output, to the control contact 200 of the spin device 100. Moreover, an Ohm-meter 950 is coupled in parallel to the spin device 100.

Providing a current with a spin polarization to be determined to the input 910 will result in a resistance value of the spin device, which depends on the spin polarization of the current. However, since the Ohm-meter 950 typically comprises high input impedance values, the current will reach the resistor 930 and create a voltage drop across the resistor 930, which is then detected by the differential amplifier 940. Although the spin polarization may be changed due to the interaction with the spin device 100, the magnitude of the current through the spin device 100 will remain unchanged.

The voltage drop across the resistor 930, which is detected and optionally further processed by the differential amplifier 940, is a measure for the magnitude of the current provided to the input 910. Due to the output of the differential amplifier 940 being coupled to the control contact 200 of the spin device 100, a feedback loop is generated so that the magnitude of the current flowing into the spin device 100 will be altered to be independent of the degree of spin polarization of the current provided to the input 910. As a consequence, a resistance value measured by the Ohm-meter 950 across the spin device 100 is a measure for the degree of spin polarization of the current provided to the input 910.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concept disclosed herein and comprehended by the claims that follow.

What is claimed is:

1. A spin device comprising:
an intermediate semiconductor region arranged between a first terminal and a second terminal, wherein the first terminal is adapted to provide a current having a first degree of spin polarization to the intermediate semiconductor region, wherein the second terminal is adapted to output the current, having passed the intermediate semiconductor region, having a second degree of spin polarization;
a spin selective scattering structure abutting the intermediate semiconductor region, the spin selective scattering structure being adapted such that the first degree of spin polarization is altered to be the second degree of spin polarization; and
a control electrode electrically insulated from the intermediate semiconductor region and adapted to apply an electrical field to the intermediate semiconductor region to control a magnitude of the current, the electrical field having a main field component perpendicular to a direction of the current through the intermediate semiconductor region.

2. The spin device according to claim 1, wherein the spin selective scattering structure comprises a ferromagnetic layer, wherein an interface between the spin selective scattering structure and the intermediate semiconductor region is formed such that a scattering property of a charge carrier of the intermediate semiconductor region depends on a spin orientation of the charge carrier.

3. The spin device according to claim 2, wherein the ferromagnetic layer is a conducting ferromagnetic layer on an insulating layer, and wherein the insulating layer is formed abutting the intermediate semiconductor region to form the interface.

4. The spin device according to claim 3, wherein the insulating layer comprises a thickness such that the scattering property of the charge carrier of the intermediate semiconductor region depends on the spin orientation of the charge carrier.

5. The spin device according to claim 3, wherein the spin selective scattering structure comprises an insulating layer, wherein the conducting ferromagnetic layer and the intermediate semiconductor region are adapted such that charge carriers in the intermediate semiconductor region are attractable towards the interface by applying a voltage to the ferromagnetic layer during operation of the spin device.

6. The spin device according to claim 1, wherein the spin selective scattering structure further comprises a biasing electrode that is electrically insulated from the intermediate semiconductor region, wherein the biasing electrode and the intermediate semiconductor region are adapted such that charge carriers in the intermediate semiconductor region are attractable towards an interface by applying a voltage to the biasing electrode during operation of the spin device.

7. The spin device according to claim 1, wherein the control electrode is electrically insulated from the intermediate semiconductor region by a further insulating layer, wherein the further insulating layer is arranged such that a further interface is formed between the further insulating layer and a part of the intermediate semiconductor region.

8. The spin device according to claim 1, wherein the spin device comprises a floating gate electrode electrically insulated from the control electrode by a tunneling insulating layer such that a charge of the floating gate electrode is changeable by tunneling from the control electrode and the charged state of the floating gate electrode contributes to the electrical field perpendicular to the direction of the current.

9. The spin device according to claim 1, wherein the intermediate semiconductor region comprises silicon.

10. A spin device comprising:
an intermediate semiconductor region arranged between a first terminal and a second terminal, wherein the first terminal is adapted to provide a current having a first degree of spin polarization to the intermediate semiconductor region, wherein the second terminal is adapted to output the current, having passed the intermediate semiconductor region, having a second degree of spin polarization; and
a spin selective scattering structure abutting the intermediate semiconductor region, the s spin selective scattering structure being adapted such that the first degree of spin polarization is altered to be the second degree of spin polarization,
wherein the spin selective scattering structure comprises a control electrode that is electrically insulated from the intermediate semiconductor region, the control electrode adapted to apply an electrical field to the intermediate semiconductor region to control a magnitude of the current, the electrical field having a main field component perpendicular to a direction of the current through the intermediate semiconductor region.

11. The spin device according to claim 10, wherein the spin selective scattering structure comprises an insulating layer abutting the intermediate semiconductor region such that an interface between the spin selective scattering structure and the intermediate semiconductor region is formed, wherein the control electrode comprises a ferromagnetic material or a ferromagnetic compound, and wherein the control electrode is formed on the insulating layer.

12. The spin device according to claim 11, wherein the insulating layer comprises a thickness such that a scattering property of charge carriers in the intermediate semiconductor region depend on a spin orientation of the charge carriers.

13. The spin device according to claim 10, wherein the spin selective scattering structure further comprises a ferromagnetic layer, wherein an interface between the spin selective scattering structure and the intermediate semiconductor region is formed such that a scattering property of charge carriers in the intermediate semiconductor region depends on a spin orientation of the charge carriers.

14. The spin device according to claim 13, wherein the spin selective scattering structure comprises an insulating layer, wherein the ferromagnetic layer comprises a conducting ferromagnetic material or a conducting ferromagnetic compound, wherein the ferromagnetic layer is formed on an insulating layer, wherein the insulating layer is formed abutting the intermediate semiconductor region to form the interface, and wherein the insulating layer comprises a thickness such that the scattering property of the charge carriers depends on the spin orientation of the charge carriers.

15. The spin device according to claim 14, wherein the control electrode is electrically insulated from the ferromagnetic layer by a tunneling insulating layer such that the ferromagnetic layer is a floating electrode, a charge state of the ferromagnetic layer is changeable by tunneling of charge carriers from the control electrode and the charge state of the ferromagnetic layer contributes to the electrical field perpendicular to the direction of the current.

16. The spin device according to claim 14, further comprising a floating gate electrode electrically insulated from the control electrode such that a charge state of the floating gate electrode is changeable by tunneling from the control electrode and the charge state of the floating gate electrode contributes to the electrical field perpendicular to the direction of the current.

17. The spin device according to claim 10, wherein the control electrode and intermediate semiconductor region are adapted such that charge carriers in the intermediate semiconductor region are attractable towards an interface between the spin selective scattering structure and the intermediate semiconductor region by applying a voltage to the control electrode during operation of the spin device.

18. The spin device according to claim 10, wherein the spin device comprises a field effect transistor structure with the intermediate semiconductor region comprising a semiconductor region in which a channel area is formed during operation, with the first terminal being a source terminal, with the second terminal being a drain terminal, and with the control electrode being a gate electrode.

19. The spin device according to claim 10, wherein the intermediate semiconductor region comprises silicon.

20. A method for providing a current having a second degree of spin polarization based on a current having a first degree of spin polarization, the method comprising:
   spin selective scattering of charge carriers of the current such that the first degree of spin polarization is altered to be the second degree of spin polarization; and
   controlling a magnitude of the current by applying an electrical field having a main component perpendicular to a direction of the current.

21. The method according to claim 20, wherein the spin selective scattering of the charge carriers comprises providing an interface such that a scattering property of the charge carriers depends on a spin orientation of the charge carriers.

22. The method according to claim 21, wherein the spin selective scattering of the charge carriers comprises increasing an interaction of the charge carriers with the interface by applying a biasing electrical field such that charge carriers are attracted towards the interface.

23. The method according to claim 20, wherein controlling the magnitude of the current comprises supplying a voltage to a control electrode.

24. The method according to claim 20, wherein controlling the magnitude of the current comprises changing a charged state of a floating gate electrode, the charged state of the floating gate electrode contributing to the electrical field perpendicular to the direction of the current.

25. A spin device comprising:
   an intermediate semiconductor region arranged between a first terminal and a second terminal, wherein the first terminal is adapted to provide a current having a first degree of spin polarization to the intermediate semiconductor region, wherein the second terminal is adapted to output the current, having passed the intermediate semiconductor region, having a second degree of spin polarization; and
   a spin selective scattering structure abutting the intermediate semiconductor region, the spin selective scattering structure being adapted such that the first degree of spin polarization is altered to be the second degree of spin polarization,
   wherein the spin selective scattering structure further comprises a floating control electrode, the floating control electrode being electrically insulated from the intermediate semiconductor region, a control electrode being electrically insulated from the intermediate semiconductor region and being electrically insulated from the floating control electrode by a tunneling insulating layer,
   wherein the tunneling insulating layer is adapted to allow a tunneling of electrical charges from the control electrode to the floating control electrode, and
   wherein the control electrode and the floating control electrode are adapted to apply an electrical field to the intermediate semiconductor region to control the current, the electrical field having a main component perpendicular to a direction of the current through the intermediate semiconductor region.

26. The spin device according to claim 25, wherein the control electrode and the intermediate semiconductor region are adapted such that charge carriers in the intermediate semiconductor region are attractable towards an interface formed between the spin selective scattering structure and the intermediate semiconductor region by applying a voltage to the control electrode during operation of the spin device.

27. A spin device comprising:
   a first intermediate semiconductor region arranged between a first terminal and a second terminal, wherein the first terminal is adapted to provide a first current having a first degree of spin polarization to the first intermediate semiconductor region,
   a first spin selective scattering structure abutting the first intermediate semiconductor region, the first selective spin scattering structure being adapted such that the first degree of spin polarization is altered to be a second degree of spin polarization,
   a second intermediate semiconductor region arranged between the first terminal and a third terminal, wherein the first terminal is further adapted to provide a second current having the first degree of spin polarization to the second intermediate semiconductor region,
   a second spin selective scattering structure abutting the second intermediate semiconductor region, the second spin selective scattering structure being adapted such that the first degree of spin polarization is altered to be a third degree of spin polarization, wherein the second terminal is adapted to output the first current;

wherein the third terminal is adapted to output the second current; and wherein the first spin selective scattering structure comprises a first control electrode being electrically insulated from the first intermediate semiconductor region, the first control electrode being adapted to apply a first electrical field to the first intermediate semiconductor region to control a magnitude of the first current, the first electrical field having a main component perpendicular to a direction of the first current through the first intermediate semiconductor region;

wherein the second spin selective scattering structure comprises a second control electrode being electrically insulated from the second intermediate semiconductor region, the second control electrode being adapted to apply a second electrical field to the second intermediate semiconductor region to control a magnitude of the second current, the second electrical field having a main component perpendicular to a direction of the second current through the second intermediate semiconductor region.

* * * * *